US012772697B2

(12) United States Patent
Yoon et al.

(10) Patent No.: US 12,772,697 B2
(45) Date of Patent: Oct. 20, 2026

(54) DISPLAY DEVICE AND METHOD FOR MANUFACTURING THE SAME

(71) Applicant: LG Display Co., Ltd., Seoul (KR)

(72) Inventors: Hyunwoo Yoon, Seoul (KR); Mingyu Lee, Goyang-si (KR); Changtaek Lim, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 452 days.

(21) Appl. No.: 18/239,430

(22) Filed: Aug. 29, 2023

(65) Prior Publication Data

US 2024/0188382 A1 Jun. 6, 2024

(30) Foreign Application Priority Data

Dec. 2, 2022 (KR) ........................ 10-2022-0167098

(51) Int. Cl.
*H10K 59/80* (2023.01)
*H10K 59/131* (2023.01)

(52) U.S. Cl.
CPC ....... *H10K 59/8721* (2023.02); *H10K 59/131* (2023.02); *H10K 59/8722* (2023.02)

(58) Field of Classification Search
CPC ............. H10K 59/8721; H10K 59/131; H10K 59/8722; H10K 59/00; H10K 59/126; H10K 59/12; H10K 59/1201; H10K 50/8423; H10K 50/8426; H10K 50/844; H10K 71/00
See application file for complete search history.

(56) References Cited

U.S. PATENT DOCUMENTS

| | | | | |
|---|---|---|---|---|
| 7,570,341 | B2 | 8/2009 | Han et al. | |
| 9,854,629 | B2 * | 12/2017 | Ikeda | H05B 33/12 |
| 10,051,766 | B2 | 8/2018 | Ham et al. | |
| 10,571,764 | B2 | 2/2020 | Lim et al. | |
| 2008/0137020 | A1 | 6/2008 | Takahashi et al. | |
| 2018/0103565 | A1 | 4/2018 | Maeyama | |
| 2019/0384105 | A1 | 12/2019 | Zhou | |
| 2020/0012133 | A1 | 1/2020 | Yanagawa et al. | |
| 2020/0127238 | A1 | 4/2020 | Ye | |

(Continued)

FOREIGN PATENT DOCUMENTS

| | | | |
|---|---|---|---|
| CN | 106405904 | A | 2/2017 |
| CN | 114038333 | A | 2/2022 |

(Continued)

*Primary Examiner* — Dale E Page
*Assistant Examiner* — Quovaunda Jefferson
(74) *Attorney, Agent, or Firm* — Birch, Stewart, Kolasch & Birch, LLP

(57) ABSTRACT

Disclosed is a display device including an array substrate including a display area, and including a light-emitting array including a plurality of light-emitting elements corresponding to a plurality of pixel areas on the display area, a sealing structure positioned on the array substrate to seal the light-emitting array, and including at least a metal barrier layer, a protective layer located on the sealing structure, a reinforcing substrate positioned on the protective layer, a printed circuit board positioned on the reinforcing substrate, and a grounding member for connecting the printed circuit board and the array substrate to each other, wherein the grounding member is in contact with the metal barrier layer of the sealing structure.

22 Claims, 14 Drawing Sheets

(56) References Cited

U.S. PATENT DOCUMENTS

| | | | | |
|---|---|---|---|---|
| 2023/0225043 | A1 | 7/2023 | Park | |
| 2024/0147773 | A1* | 5/2024 | Kim | H10K 59/122 |

FOREIGN PATENT DOCUMENTS

| | | | |
|---|---|---|---|
| CN | 116416869 | A | 7/2023 |
| EP | 3 866 205 | A1 | 8/2021 |
| KR | 10-2019-0023864 | A | 3/2019 |
| KR | 10-2021-0081953 | A | 7/2021 |
| TW | 200617482 | A | 6/2006 |
| WO | WO 2021/016988 | A1 | 2/2021 |

* cited by examiner

DISPLAY DEVICE AND METHOD FOR MANUFACTURING THE SAME

CROSS-REFERENCE TO RELATED APPLICATION

This application claims priority under 35 U.S.C. § 119(a) to Korean Patent Application No. 10-2022-0167098 filed in the Republic of Korea on Dec. 2, 2022, the contents of which in its entirety are herein incorporated by reference.

BACKGROUND

Field

The present disclosure relates to a display device including a grounding member, and a manufacturing method thereof.

Description of Related Art

A display device is applied to various electronic devices, such as TVs, mobile phones, laptops and tablets. To this end, research to develop thinner (decreased thickness), increased brightness, and reduced power consumption of display devices, is continuing.

Examples of display devices include a liquid crystal display (LCD) device, a plasma display panel (PDP) device, a field emission display (FED) device, an electro-wetting display (EWD) device, an electro-luminescence display (ELDD) device, and an organic light-emitting display (OLED) device.

An organic light-emitting display (OLED) device includes a plurality of pixel areas arranged in a display area where an image is displayed, and a plurality of organic light-emitting elements corresponding to the plurality of pixel areas.

Because the organic light-emitting element is a self-light-emitting element that emits light by itself, the organic light-emitting display device has advantages of higher response speed, greater light emitting efficiency, luminance, and viewing angle, and excellent contrast ratio and color reproduction rate compared to a liquid crystal display (LCD) device.

In one example, distortion of a driving signal transmitted to drive the organic light-emitting element can occur due to electromagnetic interference (EMI) originating externally or internally, or problems in an operation of the organic light-emitting display device can occur due to static electricity introduced from the outside. When the electromagnetic interference (EMI) is not shielded or reduced (e.g., minimized), driving stability of the organic light-emitting display device is deteriorated and picture quality is deteriorated, so that reliability of the product is lowered. That is, when EMI is not addressed, the EMI can cause a deterioration in screen quality and a reduced reliability of a display device.

Accordingly, research is being conducted to improve picture quality, improve reliability, and/or reduce deterioration.

SUMMARY

In its broadest sense, the present disclosure provides a display device including a grounding member for reducing electromagnetic interference (EMI) susceptibility.

Moreover, by introducing a grounding member to ground a metal barrier layer of sealing structure from a printed circuit board, static and transient charges are dissipated, which in turn reduces antenna effects within the display device. By reducing antenna effects in this way, the susceptibility of the display device to EMI is reduced.

Another technical purpose according to the present disclosure is to prevent cracks from occurring on a grounding member due to thermal expansion when the grounding member is introduced to an edge of a display device.

Another technical purpose according to the present disclosure is to extend a point where grounding is required by selecting and processing a position where a conductive material requiring the grounding is disposed to connect the conductive material to a grounding member to prevent the negative effects of electromagnetic interference (EMI).

Another technical purpose according to the present disclosure is to provide a method for manufacturing a display device including a grounding member.

Purposes according to the present disclosure are not limited to the above-mentioned purpose. Other purposes and advantages according to the present disclosure that are not mentioned can be understood based on following descriptions. Further, it will be easily understood that the purposes and advantages according to the present disclosure can be realized using means shown in the claims or combinations thereof.

A display device according to an aspect of the present disclosure includes an array substrate including a display area, and including a light-emitting array including a plurality of light-emitting elements corresponding to a plurality of pixel areas on the display area; a sealing structure positioned on the array substrate to seal the light-emitting array, and including at least a metal barrier layer; a protective layer located on the sealing structure; a reinforcing substrate positioned on the protective layer; a printed circuit board positioned on the reinforcing substrate; and a grounding member for connecting the printed circuit board and the array substrate to each other, wherein the grounding member is in contact with the metal barrier layer of the sealing structure.

A display device according to another example of the present disclosure includes an array substrate including a display area, and including a light-emitting array including a plurality of light-emitting elements corresponding to a plurality of pixel areas on the display area; a sealing structure including a structure where a first adhesive layer located on the array substrate and sealing the light-emitting array, a metal barrier layer on the first adhesive layer, and a second adhesive layer on the metal barrier layer are stacked; a protective layer located on the second adhesive layer of the sealing structure; a reinforcing substrate positioned on the protective layer; a printed circuit board positioned on the reinforcing substrate; and a grounding member for connecting the printed circuit board and the array substrate to each other, wherein the grounding member is in contact with a surface of the metal barrier layer exposed in a trench groove extending through the protective layer and the second adhesive layer.

Herein, an array substrate and a reinforcing substrate may sometimes be referred to. As the reader will understand from the context, the array substrate may be a substrate, for example a first substrate, which has a light-emitting array formed thereon. Similarly, the reinforcing substrate may be a substrate, for example a second substrate, which may (among other elements of the display device) provide a reinforcing function. The array and reinforcing substrates may alternatively be called a first substrate and a second substrate.

In addition, according to another example of the present disclosure, a method for manufacturing a display device is provided.

Electromagnetic interference (EMI) susceptibility can be reduced by introducing the grounding member to ground the metal barrier layer of the sealing structure from the printed circuit board.

The metal barrier layer can be disposed between a relatively thick first adhesive layer and a second adhesive layer and can be grounded (e.g. stably grounded) with the printed circuit board via a ground connection pattern. Accordingly, electromagnetic interference (EMI) susceptibility can be reduced.

Cracks can be prevented from occurring on the grounding member due to thermal expansion when the grounding member is introduced to the edge of the display device.

The position where the conductive material requiring the grounding is disposed can be selectively determined via a laser processing scheme. The conductive material can be connected to the grounding member. Accordingly, the point requiring grounding can be extended to a surface made of an insulating material, so that electromagnetic interference (EMI) susceptibility can be reduced.

Effects of the present disclosure are not limited to the effects mentioned above, and other effects not mentioned will be clearly understood by those skilled in the art from the descriptions below.

DETAILED DESCRIPTIONS

Figure 1:
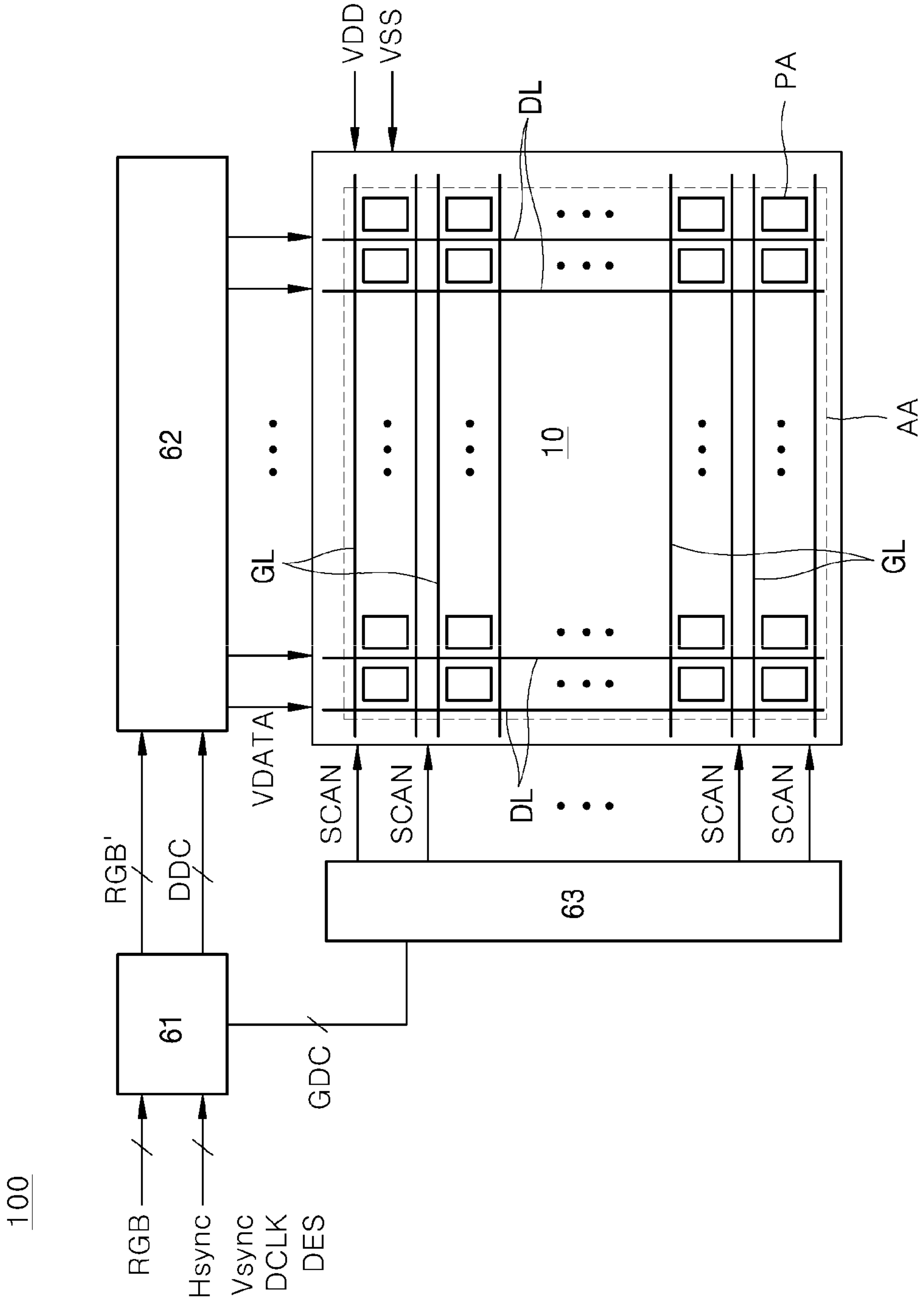
FIG. 1 is a block diagram schematically showing a display device according to an example of the present disclosure.

Advantages and features of the present disclosure, and a method of achieving the advantages and features will become apparent with reference to examples described later in detail together with the accompanying drawings. The present disclosure is not necessarily limited to the examples as disclosed hereafter, but can be implemented in various different forms, provided that they remain within the scope of the appended claims. Examples falling outside of the scope of the appended claims are merely illustrative in nature. Thus, these examples are set forth only to make the present disclosure complete, and to completely inform the scope of the present disclosure to those of ordinary skill in the technical field to which the present disclosure belongs.

For simplicity and clarity of illustration, elements in the drawings are not necessarily drawn to scale. The same reference numbers in different drawings represent the same or similar elements, and as such perform similar functionality. Further, descriptions and details of well-known steps and elements are omitted for simplicity of the description. Furthermore, in the following detailed description of the present disclosure, numerous specific details are set forth in order to provide a thorough understanding of the present disclosure. However, it will be understood that the present disclosure can be practiced without these specific details. In other instances, well-known methods, procedures, components, and circuits have not been described in detail so as not to unnecessarily obscure aspects of the present disclosure. Examples illustrated and described further below. It will be understood that the description herein is not intended to limit the claims to the specific examples described. On the contrary, it is intended to cover alternatives, modifications, and equivalents as can be included within the scope of the present disclosure as defined by the appended claims.

A shape, a size, a ratio, an angle, a number, etc. disclosed in the drawings for describing examples of the present disclosure are illustrative, and the present disclosure is not limited thereto. The same reference numerals refer to the same elements herein. Further, descriptions and details of well-known steps and elements are omitted for simplicity of the description. Furthermore, in the following detailed description of the present disclosure, numerous specific details are set forth in order to provide a thorough understanding of the present disclosure. However, it will be understood that the present disclosure can be practiced without these specific details. In other instances, well-known methods, procedures, components, and circuits have not been described in detail so as not to unnecessarily obscure aspects of the present disclosure.

The terminology used herein is directed to the purpose of describing particular examples only and is not intended to be limiting of the present disclosure. As used herein, the singular constitutes "a" and "an" are intended to include the plural constitutes as well, unless the context clearly indicates otherwise. It will be further understood that the terms "comprise", "including", "include", and "including" when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of one or more of associated listed items. Expression such as "at least one of" when preceding a list of elements can modify the entire list of elements and may not modify the individual elements of the list. In interpretation of numerical values, an error or tolerance therein can occur even when there is no explicit description thereof.

In addition, it will also be understood that when a first element or layer is referred to as being present or located "on" a second element or layer, the first element can be disposed directly on the second element or can be disposed indirectly on the second element with a third element or layer being disposed between the first and second elements or layers. A first element or layer being present or located "on" a second element or layer may refer to a stacked arrangement. It will be understood that when an element or layer is referred to as being "connected to", or "connected to" another element or layer, it can be directly on, connected to, or connected to the other element or layer, or one or more intervening elements or layers can be present. In addition, it will also be understood that when an element or layer is referred to as being "between" two elements or layers, it can be the only element or layer between the two elements or layers, or one or more intervening elements or layers can also be present.

Further, as used herein, when a layer, film, region, plate, or the like is disposed "on" or "on a top" of another layer, film, region, plate, or the like, the former can directly contact the latter or still another layer, film, region, plate, or the like can be disposed between the former and the latter. As used herein, when a layer, film, region, plate, or the like is directly disposed "on" or "on a top" of another layer, film, region, plate, or the like, the former directly contacts the latter and still another layer, film, region, plate, or the like is not disposed between the former and the latter. Further, as used herein, when a layer, film, region, plate, or the like is disposed "below" or "under" another layer, film, region, plate, or the like, the former can directly contact the latter or still another layer, film, region, plate, or the like can be disposed between the former and the latter. As used herein, when a layer, film, region, plate, or the like is directly disposed "below" or "under" another layer, film, region, plate, or the like, the former directly contacts the latter and still another layer, film, region, plate, or the like is not disposed between the former and the latter.

In descriptions of temporal relationships, for example, temporal precedent relationships between two events such as "after", "subsequent to", "before", etc., another event can occur therebetween unless "directly after", "directly subsequent" or "directly before" is not indicated.

When a certain examples can be implemented differently, a function or an operation specified in a specific block can occur in a different order from an order specified in a flowchart. For example, two blocks in succession can be actually performed substantially concurrently, or the two blocks can be performed in a reverse order depending on a function or operation involved.

It will be understood that, although the terms "first", "second", "third", and so on can be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described under could be termed a second element, component, region, layer or section, without departing from the scope of the present disclosure.

The features of the various examples of the present disclosure can be partially or entirely combined with each other, and can be technically associated with each other or operate with each other. The examples can be implemented independently of each other and can be implemented together in an association relationship.

In interpreting a numerical value, the value is interpreted as including an error range unless there is no separate explicit description thereof.

It will be understood that when an element or layer is referred to as being "connected to", or "connected to" another element or layer, it can be directly on, connected to, or connected to the other element or layer, or one or more intervening elements or layers can be present. In addition, it will also be understood that when an element or layer is referred to as being "between" two elements or layers, it can be the only element or layer between the two elements or layers, or one or more intervening elements or layers can also be present.

The features of the various examples of the present disclosure can be partially or entirely combined with each other, and can be technically associated with each other or operate with each other. The examples can be implemented independently of each other and can be implemented together in an association relationship.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

As used herein, "examples," "examples," "aspects, and the like should not be construed such that any aspect or design as described is superior to or advantageous over other aspects or designs.

Further, the term 'or' means 'inclusive or' rather than 'exclusive or'. That is, unless otherwise stated or clear from the context, the expression that 'x uses a or b' means any one of natural inclusive permutations.

The terms used in the description below have been selected as being general and universal in the related technical field. However, there can be other terms than the terms depending on the development and/or change of technology, convention, preference of technicians, etc. Therefore, the terms used in the description below should not be understood as limiting technical ideas, but should be understood as examples of the terms for describing examples.

Further, in a specific case, a term can be arbitrarily selected by the applicant, and in this case, the detailed meaning thereof will be described in a corresponding description section. Therefore, the terms used in the description below should be understood based on not simply the name of the terms, but the meaning of the terms and the contents throughout the Detailed Descriptions.

Hereinafter, a display device according to each example of the present disclosure will be described with reference to the accompanying drawings.

FIG. 1 is a block diagram schematically showing a display device according to an example of the present disclosure. In addition, FIG. 2 is a diagram showing an example of a driving thin-film transistor and an organic light-emitting element in FIG. 1.

Figure 2:
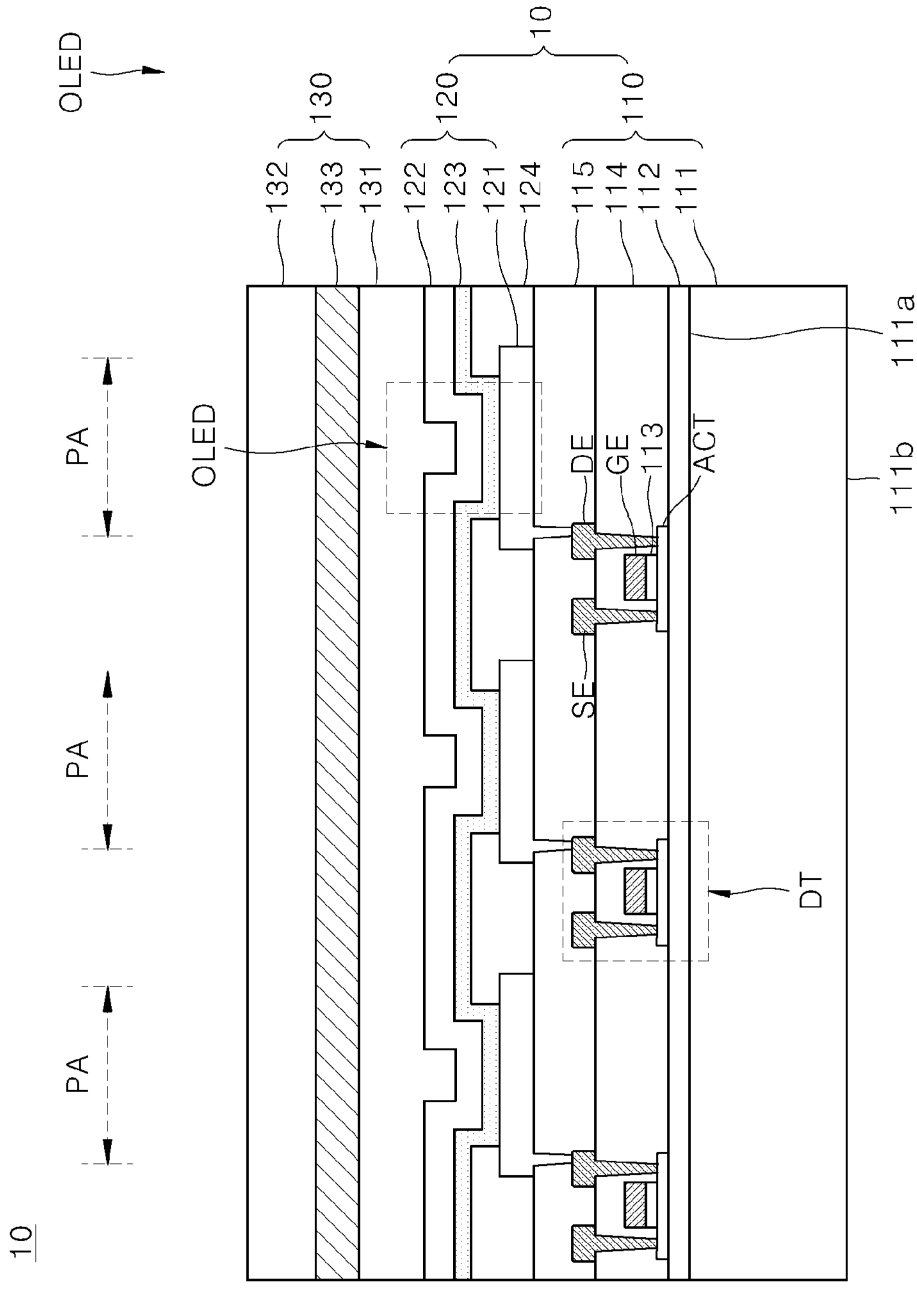
FIG. 2 is a diagram showing an example of a driving thin-film transistor and an organic light-emitting element in FIG. 1.

Referring to FIGS. 1 and 2, a display device 100 according to an example of the present disclosure includes an array substrate 10 including a display area AA in which an image is displayed, and drivers 61, 62, and 63 that supply respective signals to signal lines (gate lines GL and data lines DL) of the array substrate 10.

The array substrate 10 is a plurality of pixel areas PA defined in the display area AA. Each of the plurality of pixel areas PA is an area emitting light corresponding to a certain color. For example, the pixel areas PA in FIG. 2 can respectively emit red, green, and blue light. In some examples, pixel areas PA can be provided which respectively emit red, green, blue, and white light.

A unit pixel can be constructed by including at least three pixel areas PA emitting light of different colors among the plurality of pixel areas PA. As various colors are realized by a combination of the light emitted from the pixel areas PA constituting the unit pixel, the image can be displayed.

The array substrate 10 includes a gate line GL that supplies a scan signal SCAN for selecting a horizontal line on which a data signal VDATA is to be written, and a data line DL that supplies a data signal VDATA. The horizontal line can be composed of pixel areas arranged side by side in a horizontal direction among the plurality of pixel areas PA. The array substrate 10 can supply first driving power VDD and second driving power VSS for driving light-emitting elements.

The drivers 61, 62, and 63 for supplying the respective signals to the signal lines GL and DL of the array substrate 10 can include the timing controller 61, the data driver 62, and the gate driver 63.

The timing controller 61 re-arranges digital video data RGB input from the outside to match a resolution of the array substrate 10, and supplies re-arranged digital video data RGB' is supplied to the data driver 62.

The timing controller 61 supplies respective signals to the data driver 62 and the gate driver 63 based on timing signals such as a vertical synchronization signal Vsync, a horizontal synchronization signal Hsync, a dot clock signal DCLK, and a data enable signal DES. For example, the timing controller 61 supplies a data control signal DDC for controlling an operation timing of the data driver 62, and supplies a gate control signal GDC to control an operation timing of the gate driver 63.

The gate driver 63 is connected to the gate line GL, and sequentially supplies the scan signals SCAN to the plurality of gate lines GL corresponding to a plurality of horizontal lines during one frame period based on the gate control signal GDC.

The data driver 62 supplies, to the data line DL, the data signal VDATA corresponding to each of the pixel areas PA of the horizontal line to which the scan signal SCAN is supplied during each horizontal period based on the re-arranged digital video data RGB'.

Each pixel area PA arranged on the display area AA of the array substrate 10 can include an organic light-emitting element OLED and a pixel circuit for supplying a driving signal to the organic light-emitting element OLED. The pixel circuit can include a driving thin-film transistor DT, a switching thin-film transistor, and a storage capacitor. Each pixel area PA can further include a compensation circuit for compensating deterioration of at least one of the driving thin-film transistor DT and the organic light-emitting element OLED in addition to the pixel circuit. The compensation circuit can include at least one thin-film transistor for supplying sensing or reference power.

The organic light-emitting element OLED includes a first electrode 121, a second electrode 122, and a light-emissive layer 123 disposed between the first electrode 121 and the second electrode 122. In this regard, the first electrode can be an anode electrode, and the second electrode can be a cathode electrode. The light-emissive layer emits light based on a driving current between the first electrode and the second electrode. The organic light-emitting element OLED can have a multi-stack structure including two or more light-emissive layers.

Referring to FIG. 2, the array substrate 10 includes a transistor array 110 including a plurality of pixel circuits respectively corresponding to the plurality of pixel area PA, and a light-emitting array 120 including the plurality of organic light-emitting elements OLEDs respectively corresponding to the plurality of pixel area PA.

The transistor array 110 can include a base substrate 111 including the display area AA corresponding to the plurality of pixel area PAs, and the driving thin-film transistor DT disposed on the base substrate 111 and corresponding to each pixel area PA. The transistor array 110 can further include a planarization film 115 that flatly covers the driving thin-film transistor DT (e.g., the planarization film 115 forms a planar or flat surface that covers the driving thin-film transistor DT).

The base substrate 111 can be made of a flat (e.g., planar) insulating material. For example, the base substrate 111 can be made of glass or plastic (e.g., that forms a flat or planar surface). The base substrate 111 can include a first surface 111*a* and a second surface 111*b* opposite to the first surface 111*a*. In one example, the first surface 111*a* can be referred to as a front surface, and the second surface 111*b* can be referred to as a rear surface. The driving thin-film transistor DT can be disposed on the first surface 111*a* of the base substrate 111.

The driving thin-film transistor DT can include an active layer ACT disposed on a buffer film 112 for covering the base substrate 111, a gate electrode GE overlapping (e.g., overlapping in a vertical direction or stacking direction) a channel area of the active layer ACT, a gate insulating layer 113 disposed between (e.g., disposed directly between) the active layer ACT and the gate electrode GE, a source electrode SE disposed on (e.g., disposed directly on) an interlayer insulating film 114 for covering the buffer layer 112, the active layer ACT, and the gate electrode GE and connected (e.g., directly connected) to a source area of the active layer ACT, and a drain electrode DE disposed on the interlayer insulating film 114 and connected to (e.g., directly connected) connected to a drain area of the active layer ACT. The source electrode SE and the drain electrode DE can be disposed to be in direct contact with the active layer ACT, and can be disposed spaced apart from each other with the gate electrode GE interposed therebetween.

The buffer layer 112 can be made of an insulating material such as silicon nitride (SiNx) and silicon oxide (SiOx), that facilitates adhesion of the active layer ACT to the buffer layer 112. The buffer film 112 may not only help to fix (e.g., attach) the active layer ACT, but also block moisture or oxygen from permeating via the base substrate 111, and block defects in the base substrate 111 from leading to the insulating films 114 and 115 on the base substrate 111.

The active layer ACT can be formed to include at least one of amorphous silicon, polycrystalline silicon, or an oxide semiconductor.

In addition, the gate line GL can be disposed (e.g., positioned) on a gate insulating film 113 like the gate electrode GE of the driving thin-film transistor DT. Moreover, the data line DL can be disposed (e.g., positioned) on the interlayer insulating film 114, like the source electrode SE and the drain electrode DE of the driving thin-film transistor DT.

The interlayer insulating film 114 is disposed on the buffer film 112 and covers the active layer ACT and the gate electrode GE, and provides a flat (e.g. forms a flat or planar surface) upper surface. The interlayer insulating film 114 can have a structure in which one of an organic insulating material and an inorganic insulating material or two or more insulating materials are stacked. For example, the inorganic insulating material can include silicon nitride (SiNx) or silicon oxide (SiOx). The organic insulating material can include acrylic resin, epoxy resin, phenolic resin, polyamide resin, polyimide resin, and the like.

Like the interlayer insulating film 114, the planarization film 115 can have the structure in which one of the organic insulating material and the inorganic insulating material or the two or more insulating materials are stacked.

The light-emitting array 120 can be disposed on the planarization film 115 of the transistor array 110, and can provide the plurality of organic light-emitting elements OLED respectively corresponding to the plurality of pixel areas PA. Each organic light-emitting element OLED can include a first electrode 121 and a second electrode 122 opposite to each other, and a light-emissive layer 123 disposed between the first and the second electrodes 121 and 122.

The light-emitting array 120 can include a bank 124. The bank 124 can be disposed to expose a partial area of the first electrode 121 and to cover the remaining portion of the first electrode 121. The bank 124 is a boundary area defining the light-emitting area in the pixel area PA, and serves to distinguish adjacent pixel areas PA. Where the bank exposes the first electrode 121, a pixel area PA is defined. The bank 124 serves as a barrier to prevent light of different colors from the adjacent pixel areas PA from being mixed with each other and output.

The first electrode 121 can be electrically connected to the gate electrode GE via the drain electrode DE. For example, the first electrode 121 can include a transparent metal oxide such as indium-tin-oxide (ITO) or indium-zinc-oxide (IZO). The first electrode 121 can also be referred to as an anode electrode or a pixel electrode.

The second electrode 122 can be formed as a common electrode for applying a voltage in common contact with the adjacent pixel areas PA. The second electrode 122 can also be referred to as a cathode electrode. For example, the second electrode 122 can be made of a transparent metal oxide such as the indium-tin-oxide (ITO) or the indium-zinc-oxide (IZO). Alternatively, the second electrode 122 can be made of a translucent metal material composed of molybdenum (Mo), tungsten (W), silver (Ag), or aluminum (Al), and an alloy including at least one of those.

The organic light-emitting element OLED according to an example of the present disclosure can be constructed to be of a bottom emission type in which light is emitted to the outside via a second surface 111*b*, which is a direction of a rear surface of the base substrate 111. Accordingly, the thin-film transistor DT can be positioned below the bank 124 so as not to overlap a position where the light is emitted.

The organic light-emitting element OLED includes an organic material that can be easily deteriorated by the moisture and the oxygen. Accordingly, to prevent the organic material from being exposed to the moisture and the oxygen and to delay the deterioration of the organic material, the organic light-emitting display device can include a sealing structure 130 for sealing the plurality of organic light-emitting elements OLEDs.

The sealing structure 130 includes a first adhesive layer 131, a second adhesive layer 132, and a metal barrier layer 133 disposed between (e.g., directly between) the first adhesive layer 131 and the second adhesive layer 132. The first adhesive layer 131 and the second adhesive layer 132 can include polymer materials having adhesive properties. The metal barrier layer 133 can have a relatively smaller thickness than the first adhesive layer 131 and the second adhesive layer 132. That is, the sealing structure 130 can include a component for separating the first adhesive layer 131 and the second adhesive layer 132 from each other as the metal barrier layer 133 in a thin-film shape is disposed between the first adhesive layer 131 and the second adhesive layer 132, which are relatively thicker than the metal barrier layer 133.

A display device equipped with a sealing structure will be described with reference to the following drawings.

Figure 3:
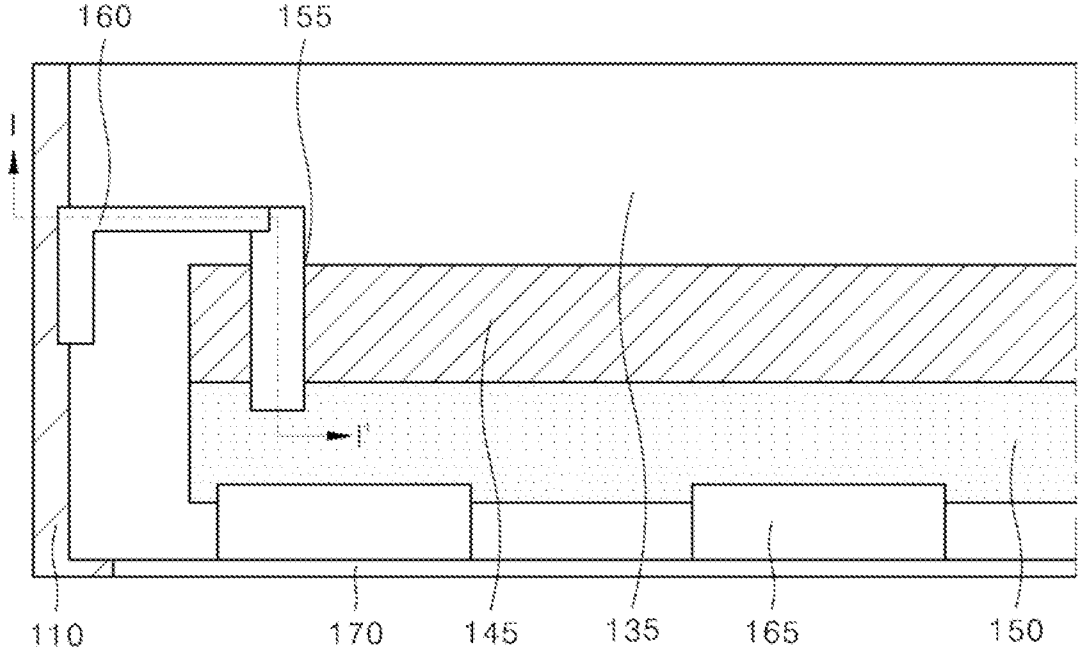
FIGS. 3 and 4 are diagrams showing a display device according to a first example of the present disclosure.
Figure 4:
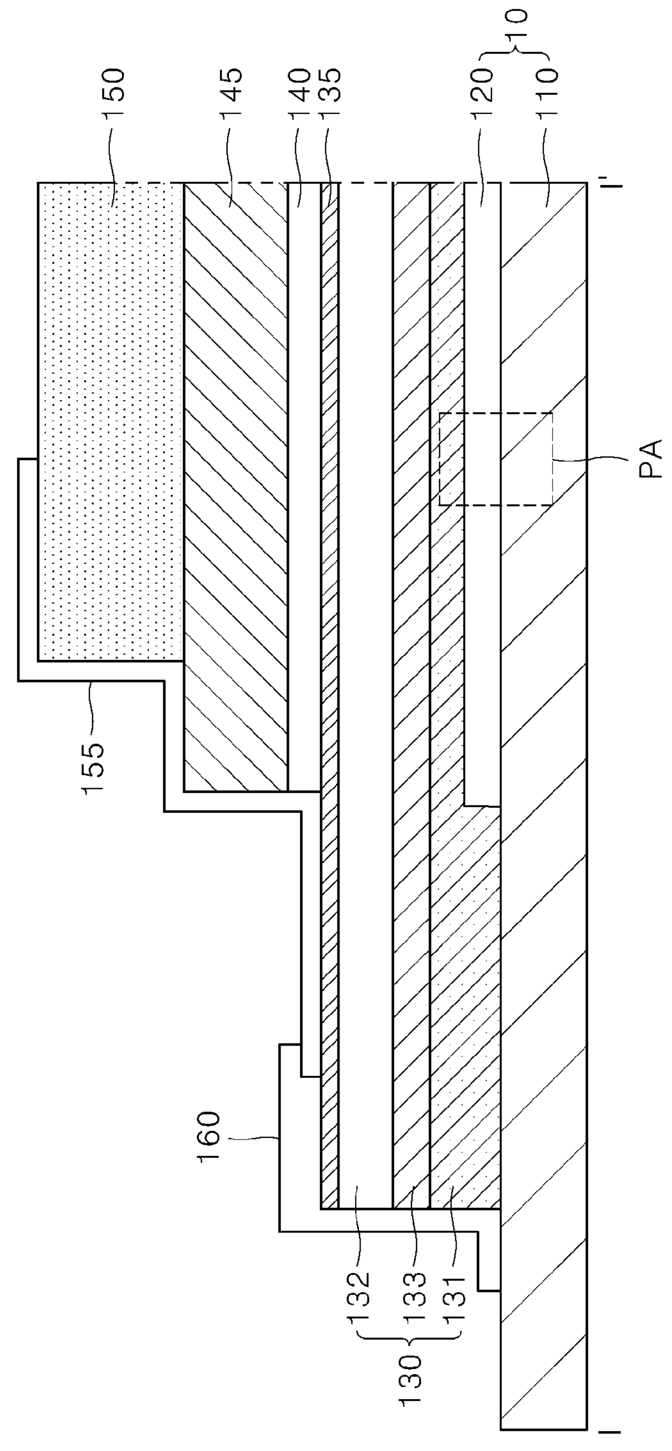

FIGS. 3 and 4 are diagrams showing a display device according to a first example of the present disclosure.

Referring to FIGS. 3 and 4, the display device includes the array substrate 10. The array substrate 10 can include the light-emitting array 120 including the plurality of pixel areas PA respectively including the plurality of organic light-emitting elements OLEDs, and the transistor array 110 including the pixel circuit. The organic light-emitting element OLED located in the light-emitting array 120 can be formed to include the components in FIG. 2. For example, the organic light-emitting element OLED can be constructed to have a bottom emission structure in which the light is emitted to the outside via the second surface 111*b*, which is the direction of the rear surface of the base substrate 111 (see FIG. 2).

The array substrate 10 can block the moisture and the oxygen from permeating to the light-emitting array 120 from the outside via the sealing structure 130. The sealing structure 130 can include a structure in which the first adhesive layer 130, the metal barrier layer 133, and the second adhesive layer 132 are sequentially stacked. That is, the metal barrier layer 133 is stacked (e.g., in a vertical direction) onto (e.g., directly onto) the first adhesive layer 130 and the second adhesive layer 132 is stacked (e.g., in a vertical direction) onto (e.g., directly onto) the first adhesive layer 131. Each of the first adhesive layer 131 and the second adhesive layer 132 can include a polymer material having adhesiveness (e.g., adhesive qualities).

The metal barrier layer 133 can be disposed between the first adhesive layer 130 and the second adhesive layer 132 to reinforce adhesion between the first and second adhesive layers 130 and 132. The metal barrier layer 133 can include a metal material that is relatively hard. For example, the metal barrier layer 133 can be formed of a thin-film including metal materials such as aluminum (Al), copper (Cu), tin (Sn), silver (Ag), iron (Fe), and zinc (Zn).

The second adhesive layer 132 can be formed to include a polymer material that does not include a carboxyl group so as to prevent corrosion of the metal barrier layer 133. For example, the second adhesive layer 132 can include an olefin-based polymer material that does not include the carboxyl group. Accordingly, the corrosion of the metal barrier layer 133 can be prevented, and a high-quality panel can be formed.

The metal barrier layer 133 can have a relatively smaller thickness than the first adhesive layer 131 and the second adhesive layer 132. Moreover, each of the first adhesive layer 131 and the second adhesive layer 132 can have a relatively greater thickness than the metal barrier layer 133.

That is, the sealing structure 130 can include the component for separating the first adhesive layer 131 and the second adhesive layer 132 from each other as the metal barrier layer 133 in the thin-film shape is disposed between the first adhesive layer 131 and the second adhesive layer 132, which are relatively thicker than the metal barrier layer 133.

A protective layer 135 (see FIG. 3) can be disposed on the sealing structure 130. The protective layer 135 can be disposed on the second adhesive layer 132 located at the uppermost surface of the sealing structure 130. The protective layer 135 can further secure rigidity of the display device and prevent the array substrate 10 including the light-emitting array 120 and the transistor array 110 from being damaged by external impact. The rigidity can be understood as a property of an object to resist shape or volume deformation when applied with a force. In one example, the protective layer 135 can include polyethylene terephthalate (hereinafter, referred to as PET).

A reinforcing substrate 145 can be disposed on the protective layer 135. The reinforcing substrate 145 can be disposed on the protective layer 135 via an adhesive layer 140 (see FIG. 4). The reinforcing substrate 145 can be disposed on a non-light emissive surface opposite to a light emissive surface of the array substrate 10. The reinforcing substrate 145 can include a metal material to effectively disperse and dissipate heat (e.g., from the light-emitting array 120) when the light-emitting array 120 emits the light. For example, the reinforcing substrate 145 can be made of a metal material including components of aluminum (Al), copper (Cu), tin (Sn), silver (Ag), iron (Fe), and zinc (Zn).

A printed circuit board (PCB) 150 can be disposed on the reinforcing substrate 145. The printed circuit board 150 can be equipped with components such as an integrated circuit chip that controls the driving timing of the array substrate 10. Referring to FIG. 3, the reinforcing substrate 145 and the printed circuit board 150 can be disposed at the edge of the display device. A chip-on-film (COF) 165 can be disposed on one side surface of the printed circuit board 150 and electrically connected to a pad on the array substrate 10. The COF 165 can be provided in plurality, with each COF 165 being spaced apart from one another. The pad disposed on the array substrate 10 is covered with a side sealing material 170 to prevent the penetration of the moisture and the oxygen (e.g., to weather-seal).

In one example, electromagnetic interference (EMI) caused by external or internal factors can cause deterioration of an image quality, for instance, by causing (e.g., creating) a disturbance on the display panel by an unnecessary electromagnetic signal or electromagnetic noise. Accordingly, the display device according to each example of the present disclosure can dissipate the electromagnetic signal or electromagnetic noise by introducing a grounding member.

For example, grounding members 155 and 160 extending from the printed circuit board 150 can be included. The grounding members 155 and 160 can include a first grounding member 155 and a second grounding member 160. The first grounding member 155 can extend from an upper surface of the printed circuit board 150 to a side edge of the printed circuit board 150, and the first grounding member 155 can extend to an upper surface and a side edge of the reinforcing substrate 145, and the first grounding member 155 extend to an exposed surface of the protective layer 135. The first grounding member 155 can include a conductive tape including, for example, copper (Cu) as a conductive material.

The first grounding member 155 can be disposed on the exposed surface of the protective layer 135. In one example, the metal barrier layer 133 including the metal material is disposed between the first adhesive layer 131 and the second adhesive layer 132 of the sealing structure 130. However, when grounding is not performed on the metal barrier layer 133, electromagnetic interference (EMI) susceptibility can increase as the metal barrier layer 133 including the metal material serves as an antenna for absorbing surrounding noise signals.

Accordingly, the second grounding member 160 can be introduced (e.g., be provided) to extend the grounding members 155 and 160 to a surface of the transistor array 110 including the insulating material. The second grounding member 160 can be formed in a line-shaped pattern and can include a metal material. For example, the second grounding member 160 can be formed by applying silver (Ag) in the line-shaped pattern. The line-shaped pattern can include an "L" shape.

The second grounding member 160 can be overlapped and connected to an end of the first grounding member 155 disposed on the exposed surface of the protective layer 135 and extended so as to be in contact with an exposed surface of the metal barrier layer 133 of the sealing structure 130, as shown in FIG. 4. Further, the first grounding member 155 can be overlapped with and connected to the reinforcing substrate 145 and the printed circuit board 150. Additionally, the second grounding member 160 can be attached to the first grounding member 155 at a face thereof, by forming a butt-joint between the first grounding member 155 and the second grounding member 160.

Accordingly, as a grounding path is formed via the grounding members 155 and 160 extending from the upper surface of the printed circuit board 150 to the outermost portion of the display device, any unnecessary electromagnetic signals can be dissipated to the outside. By dissipating the any unnecessary electromagnetic signals to the outside, susceptibility to electromagnetic interference (EMI) can be reduced.

Figure 5:
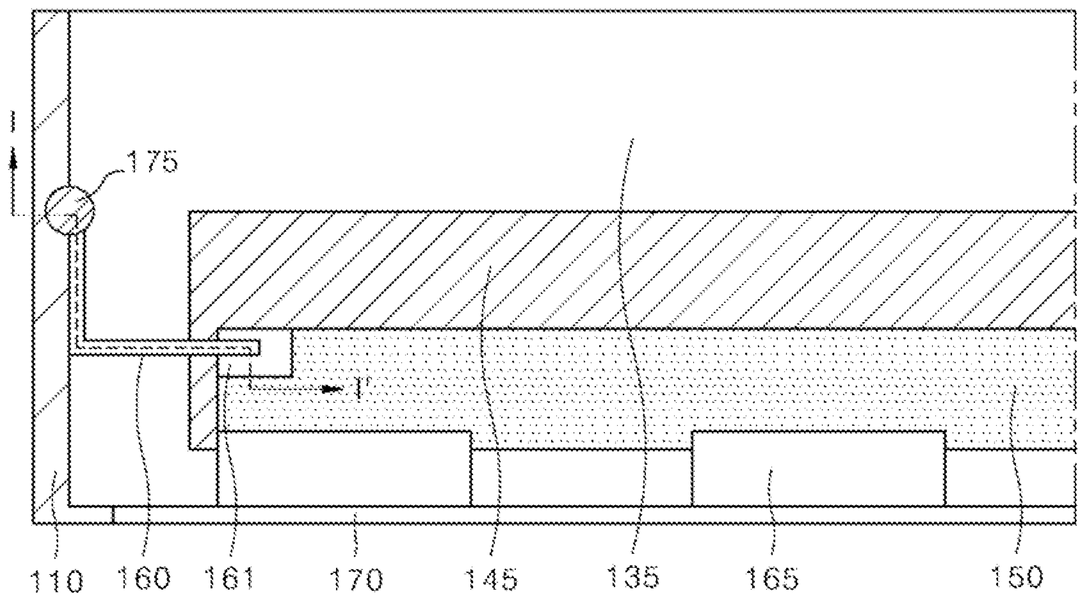
FIGS. 5 and 6 are diagrams showing a display device according to a second example of the present disclosure.
Figure 6:
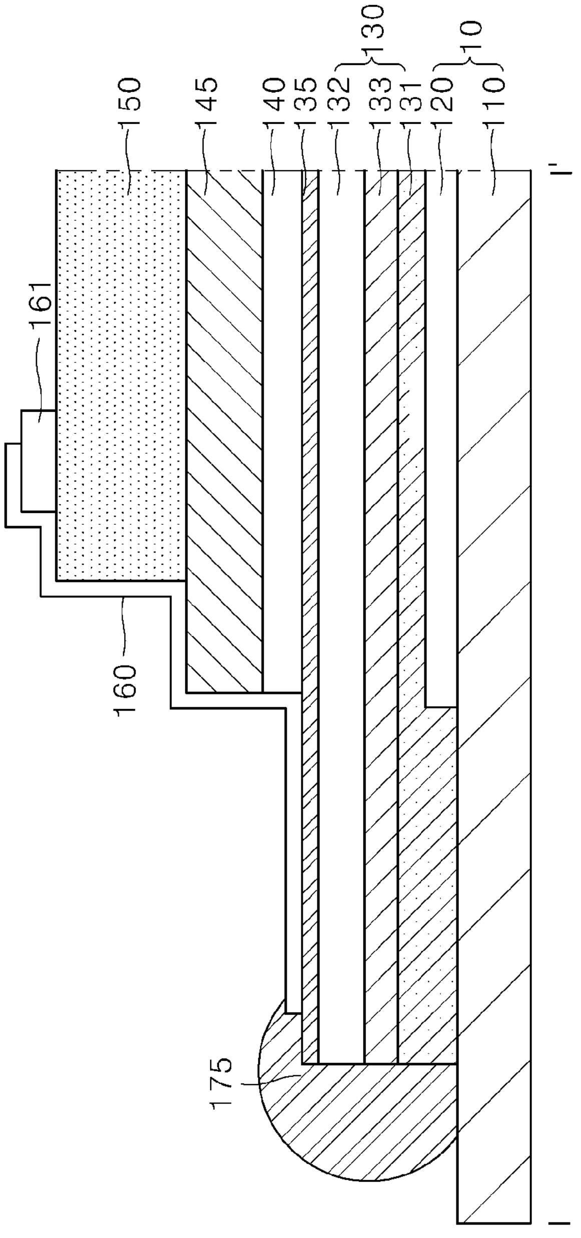

FIGS. 5 and 6 are diagrams showing a display device according to a second example of the present disclosure. In FIGS. 5 and 6, structures and arrangement positions of the grounding members are different from those in FIGS. 3 and 4, but the rest of the components are equally applied, so that descriptions of duplicated components are omitted or simplified.

Referring to FIGS. 5 and 6, the display device includes the sealing structure 130 for sealing the array substrate 10. The array substrate 10 can include the light-emitting array 120 and the transistor array 110. The sealing structure 130 can have the structure in which the first adhesive layer 131, the barrier metal layer 133, and the second adhesive layer 132 are stacked.

The metal barrier layer 133 can have the relatively smaller thickness than the first adhesive layer 131 and the second adhesive layer 132. Moreover, each of the first adhesive layer 131 and the second adhesive layer 132 can have the relatively greater thickness than the metal barrier layer 133. That is, the sealing structure 130 can include the component for separating the first adhesive layer 131 and the second adhesive layer 132 from each other as the metal barrier layer 133, and the metal barrier layer 133 can have a thin-film shape and be disposed between the first adhesive layer 131 and the second adhesive layer 132, and the first adhesive layer 131 and the second adhesive layer 132 are relatively thicker than the metal barrier layer 133.

The protective layer 135 can be disposed on the sealing structure 130. The reinforcing substrate 145 and the printed circuit board 150 can be disposed on the protective layer 135. The reinforcing substrate 145 can be disposed on the protective layer 135 via the adhesive layer 140. The printed circuit board 150 can be located at an edge of the reinforcing substrate 145 and not cover a portion of a surface of the protective layer 135 so as to be exposed.

A ground pad 161 can be disposed on the upper surface of the printed circuit board 150. The ground pad 161 can include a conductive material. On the printed circuit board 150, grounding members 160 and 175 extending from the upper surface of the printed circuit board 150 to a lower layer while being connected to the ground pad 161 can be disposed.

The grounding members 160 and 175 can include the second grounding member 160 (the second grounding member 160 can also be referred to "a grounding member") and a ground extension pattern 175. The second grounding member 160 can extend from the upper surface of the printed circuit board 150 to the side surface edge of the printed circuit board 150, and can extend to the upper surface and the side edge of the reinforcing substrate 145 and extend to the exposed surface of the protective layer 135.

The second grounding member 160 can be formed in a line-shaped pattern and can including a metal material. For example, the second grounding member 160 can be formed by applying silver (Ag) in the line shape.

The grounding extension pattern 175 can serve to ground the metal barrier layer 133 of the sealing structure 130 and prevent the metal barrier layer 133, which includes a metal material, from acting as an antenna for absorbing surrounding noise signals. The grounding extension pattern 175 can extend to overlap an end of the second grounding member 160 and to be in contact with the exposed surface of the metal barrier layer 133.

The ground extension pattern 175 can include a cured conductive paste. The cured conductive paste can include a metal material having electrical conductivity. For example, a silver (Ag) paste can be included in the ground extension pattern 175.

Accordingly, as the grounding path is formed to include the second grounding member 160 extending from the upper surface of the printed circuit board 150 to the outermost portion of the display device and the grounding extension pattern 175, any unnecessary electromagnetic signals can be emitted to the outside. Noise occurrence, resulting from the electromagnetic wave interference, can be prevented by emitting any unnecessary electromagnetic signals to the outside.

Figure 7:
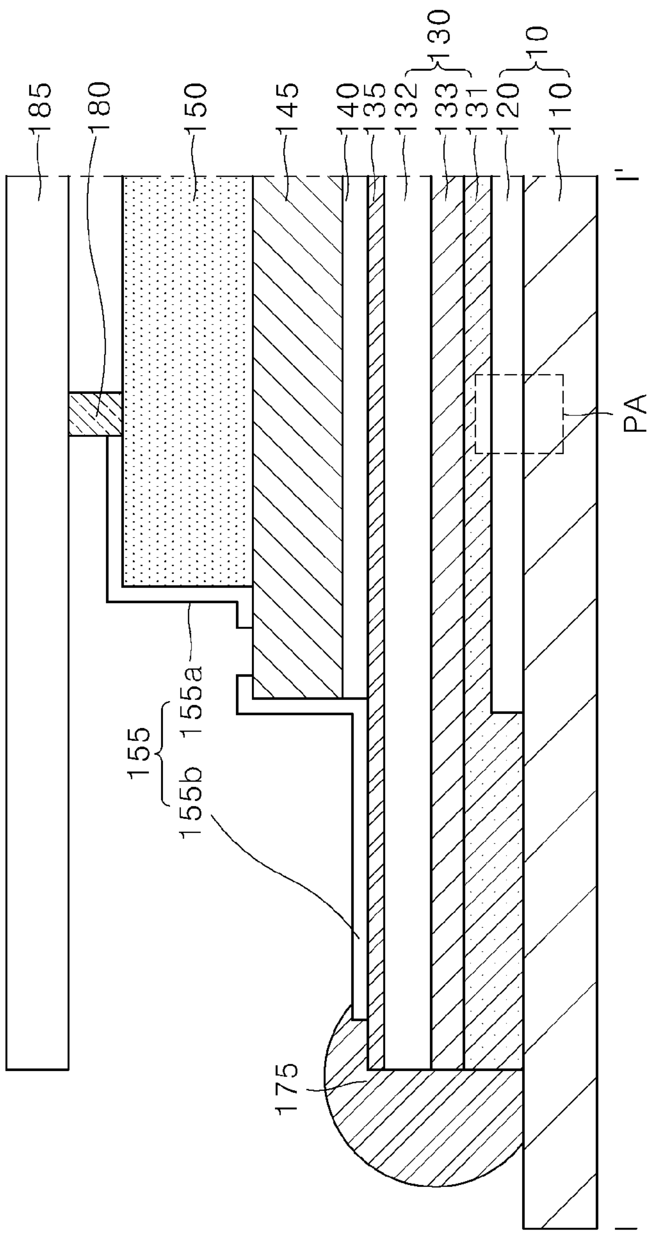
FIG. 7 is a diagram showing a display device according to a third example of the present disclosure.

FIG. 7 is a diagram showing a display device according to a third example of the present disclosure. In FIG. 7, a configuration of the grounding members are different from that in FIG. 6, but the rest of the components are equally applied, so that descriptions of duplicated components are omitted or simplified.

Referring to FIG. 7, the display device includes the sealing structure 130 for sealing the array substrate 10. The array substrate 10 can include the light-emitting array 120 and the transistor array 110. The sealing structure 130 can have the structure in which the first adhesive layer 131, the metal barrier layer 133, and the second adhesive layer 132 are stacked. That is, the metal barrier layer 133 can be stacked onto the first adhesive layer 131, and the second adhesive layer 132 can be stacked onto the metal barrier layer 133. However, the adhesive layers 131 and 132 can be differently arranged.

The metal barrier layer 133 can have the relatively smaller thickness than the first adhesive layer 131 and the second adhesive layer 132. Moreover, each of the first adhesive layer 131 and the second adhesive layer 132 can have the relatively greater thickness than the metal barrier layer 133. That is, the sealing structure 130 can include the component for separating the first adhesive layer 131 and the second adhesive layer 132 from each other as the metal barrier layer 133 in the thin-film shape is disposed between the first adhesive layer 131 and the second adhesive layer 132, which are relatively thicker than the metal barrier layer 133.

The protective layer 135 can be disposed on the sealing structure 130. The reinforcing substrate 145 and the printed circuit board 150 can be disposed on the protective layer 135. The printed circuit board 150 can be located at the edge of the reinforcing substrate 145 and not cover the portion of the surface of the protective layer 135 so as to be exposed.

A gasket member 180 can be disposed on the upper surface of the printed circuit board 150. The gasket member 180 can include a conductive material such as aluminum (Al), copper (Cu), tin (Sn), silver (Ag), iron (Fe), and zinc (Zn). A bottom cover 185 can be disposed on the gasket member 180. The bottom cover 185 can accommodate the array substrate 10, the sealing structure 130, and the reinforcing substrate 145, and can include a metal material.

Grounding members 155 and 175 extending from the upper surface of the printed circuit board 150 to a surface of the second adhesive layer 132, which is an uppermost layer of the sealing structure 130, can be disposed. The grounding members 155 and 175 can include the first grounding member 155 and the grounding extension pattern 175. The first grounding member 155 can include a conductive tape and can be comprised of copper (Cu), or any other conductive material. The first grounding member 155 can include a first portion **155*a* and a second portion 155*b***.

The first portion **155*a* of the first grounding member 155 can extend from the upper surface to the side edge of the printed circuit board 150, and can be located on the upper surface of the reinforcing substrate 145. The second portion 155*b* of the first grounding member 155 can be spaced apart from the first portion 155*a* by a predetermined spacing and can extend to the upper surface of the protective layer 135. The second portion 155*b* of the first grounding member 155 can be disposed to be spaced apart from the first portion 155*a* by the predetermined spacing, but can transmit any unnecessary electromagnetic signals to the first portion 155*a* of the first grounding member 155 via the reinforcing substrate 145** made of the metal material.

The grounding extension pattern 175 can serve to ground the metal barrier layer 133 of the sealing structure 130 and prevent the metal barrier layer 133 including the metal material from acting as the antenna for absorbing the surrounding noise signals. The grounding extension pattern 175 can extend to overlap an end of the first portion **155*a* of the first grounding member 155 and to be in contact with the exposed surface of the metal barrier layer 133**.

The grounding extension pattern 175 can include a cured conductive paste. The cured conductive paste can include a metal material having electrical conductivity. For example, the silver (Ag) paste can be included, however, any other metal material that is conductive can be used.

Accordingly, as the grounding path is formed to include the first grounding member 155 extending from the upper surface of the printed circuit board 150 to the outermost portion of the display device and the grounding extension pattern 175, any unnecessary electromagnetic signals can be emitted to the outside. The noise occurrence resulted from the electromagnetic wave interference can be prevented by emitting any unnecessary electromagnetic signals to the outside.

In one example, the grounding extension pattern 175 formed by curing the conductive paste onto the transistor array 110, the sealing structure 130 and the adhesive layer 140, such that the grounding extension pattern is disposed on the outermost portion of the display device. However, a cured surface of the conductive paste disposed on the outermost portion can be greatly affected by contraction and expansion, as evidenced by a reliability measurement experiment in which the display device is applied with high-temperature and is heated or cooled. Cracks can occur on the cured surface of the conductive paste due to the effect of the contraction and the expansion, which can cause defects in the display device. The conductive paste can be cured in a controlled environment to improve adhesive and resist cracking. In addition, fibrous materials, such as carbon fiber, fiberglass, or the like, can be used in the conductive paste to enhance its crack-resistance.

Moreover, the grounding extension pattern 175 disposed on the outermost portion of the display device must be in contact with the exposed surface of the metal barrier layer 133 to emit any unnecessary electromagnetic signals to the outside. In addition, in order for the grounding extension pattern 175 and the metal barrier layer 133 to come into contact with each other, an outermost side surface of the sealing structure 130 must be aligned such that the first adhesive layer 131, the second adhesive layer 132, and the metal barrier layer 133 are positioned on a same plane.

However, defects can occur in a process of forming the sealing structure 130 disposed at the outermost portion of the display device. In one example, a defect in which the second adhesive layer 132 positioned on top of the metal barrier layer 133 covers the outermost side surface of the metal barrier layer 133 can occur. When such a defect occurs, because the outermost side surface portion of the metal barrier layer 133 is not exposed to the outside, the grounding extension pattern 175 and the metal barrier layer 133 do not come into contact with each other, so that a defect in which grounding is not achieved, can occur.

Accordingly, in other examples of the present disclosure, it is to describe a structure capable of solving the problem of cracks that can occur when using the conductive paste as the grounding member and the problem of grounding defects that can occur because the outermost side surface of the metal barrier layer 133 is not exposed to the outside.

Figure 8:
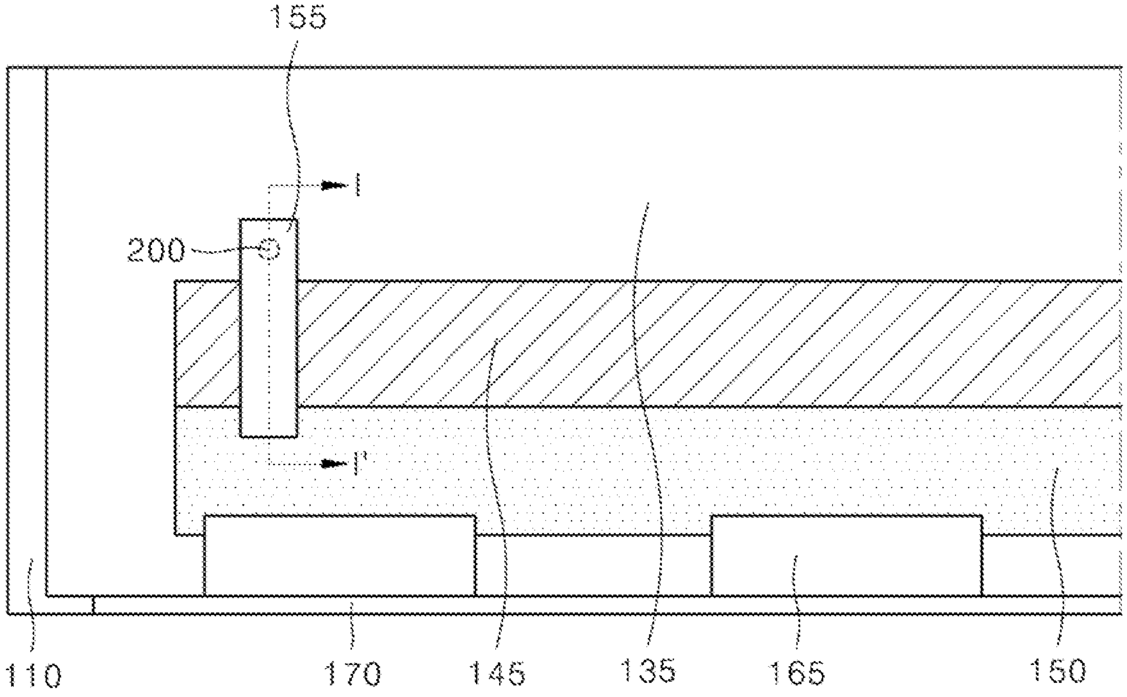
FIGS. 8 and 9 are diagrams showing a display device according to a fourth example of the present disclosure.
Figure 9:
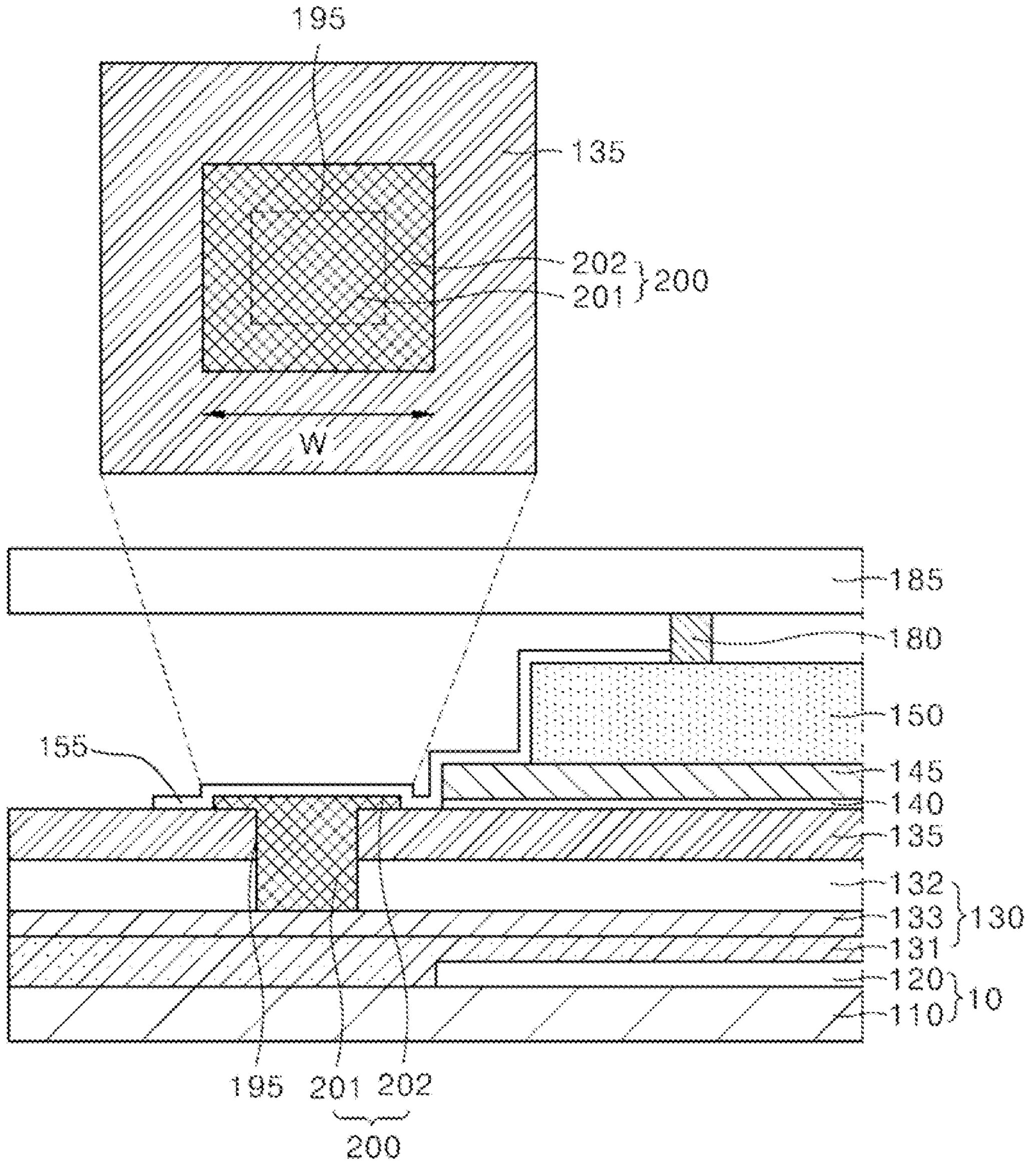

FIGS. 8 and 9 are diagrams showing a display device according to a fourth example of the present disclosure. In FIGS. 8 and 9, structures and arrangement positions of the grounding members are different from those in FIGS. 3 and 4, but the rest of the components are equally applied, so that descriptions of duplicated components are omitted or simplified.

Referring to FIGS. 8 and 9, the display device includes the sealing structure 130 for sealing the array substrate 10. The array substrate 10 can include the light-emitting array 120 and the transistor array 110. The sealing structure 130 can have the structure in which the first adhesive layer 131, the metal barrier layer 133, and the second adhesive layer 132 are stacked.

The metal barrier layer 133 can have the relatively smaller thickness than the first adhesive layer 131 and the second adhesive layer 132. Moreover, each of the first adhesive layer 131 and the second adhesive layer 132 can have the relatively greater thickness than the metal barrier layer 133. That is, the sealing structure 130 can include the component for separating the first adhesive layer 131 and the second adhesive layer 132 from each other as the metal barrier layer 133 in the thin-film shape is disposed between the first adhesive layer 131 and the second adhesive layer 132, which are relatively thicker than the metal barrier layer 133.

The protective layer 135 can be disposed on the sealing structure 130. The reinforcing substrate 145 and the printed circuit board 150 can be disposed on the protective layer 135. The reinforcing substrate 145 can be disposed on the protective layer 135 via the adhesive layer 140. The printed circuit board 150 can be located at the edge of the reinforcing substrate 145 and not cover the portion of the surface of the protective layer 135 so as to be exposed.

The display device can include a trench groove 195 extending through the protective layer 135 and extending through the second adhesive layer 132 of the sealing structure 130. The trench groove 195 can expose a portion of the upper surface of the metal barrier layer 133.

When viewed from a plane, the trench groove 195 can have an island shape surrounded by the second adhesive layer 132, however, the trench groove 195 can have any shape. For example, the trench groove 195 can have a shape such as a rectangle, a square, a circle, or an ellipse when viewed from the plane (e.g., when viewed from a stacking direction of the display device). Referring to FIG. 9, the trench groove 195 is shown to be located at a left side of the display device, but is not limited thereto. For example, the trench groove 195 can be defined at a right side of the display device, and the display device can include a plurality of trench grooves.

A ground connection pattern 200 filling the trench groove 195 can be included. The ground connection pattern 200 can include a body 201 whose bottom surface is in contact with the upper surface of the metal barrier layer 133 and a head 202 extending from the body 201 and extending to and covering a portion of the upper surface of the protective layer 135. Because the ground connection pattern 200 has the head 202 that is relatively wider than the body 201, the ground connection pattern 200 can have a 'T' shape when viewed in a cross-section. The ground connection pattern 200 can have a width W in a range from 1 mm to 3 mm. The head 202 can overlap a portion of the protective layer 135.

The gasket member 180 can be disposed on the upper surface of the printed circuit board 150. The gasket member 180 can include the conductive material. The bottom cover 185 can be disposed on the gasket member 180. The bottom cover 185 can accommodate the array substrate 10, the sealing structure 130, and the reinforcing substrate 145, and can include the metal material.

The first grounding member 155 extending toward the protective layer 135 from the upper surface of the printed circuit board 150 can be disposed. The first grounding member 155 can extend from the upper surface of the printed circuit board 150 to the side edge of the printed circuit board 150, and can extend to the upper surface and the side edge of the reinforcing substrate 145 and extend onto the exposed surface of the protective layer 135. The first grounding member 155 can include the conductive tape including copper (Cu) as the conductive material.

Moreover, the first grounding member 155 can be disposed overlapping the position where the head 202 of the ground connection pattern 200 is disposed. As the first grounding member 155 is in contact with the head 202 of the ground connection pattern 200, the first grounding member 155 can be connected to the metal barrier layer 133 connected to the bottom surface of the ground connection pattern 200. That is, the first grounding member can be in contact with, and completely surround, the head 202 of the ground connection pattern 200.

Accordingly, as the grounding member including the ground connection pattern in contact with the metal barrier layer 133 constituting the sealing structure 130 is formed, any unnecessary electromagnetic signals can be emitted to the outside. The noise occurrence resulted from the electromagnetic wave interference can be prevented by emitting any unnecessary electromagnetic signals to the outside.

Moreover, as the ground connection pattern 200 that is in contact with the metal barrier layer 133 by extending through the protective layer 135 and the second adhesive layer 132 of the sealing structure 130 is formed, the ground path that has been extended to the outermost portion of the display device can be reduced in a length. Accordingly, any unnecessary electromagnetic signals can be emitted to the outside more quickly.

Moreover, as the ground connection pattern 200 that is in contact with the metal barrier layer 133 by extending through the protective layer 135 and the second adhesive layer 132 of the sealing structure 130 is formed, the occurrence of the grounding defects that can occur because the outermost side surface of the metal barrier layer 133 is not exposed when the ground connection pattern is connected at the outermost portion of the sealing structure 130 can be prevented.

Moreover, as the metal barrier layer 133 disposed between the relatively thick first adhesive layer 131 and second adhesive layer 132 is stably grounded with the printed circuit board 150 via the ground connection pattern 200, there is an effect of reducing susceptibility to electromagnetic interference (EMI).

Moreover, cracks can be prevented from occurring due to the contraction and the expansion of the cured surface of the conductive paste (e.g., grounding extension pattern 175) disposed on the outermost portion of the display device.

Figure 10:
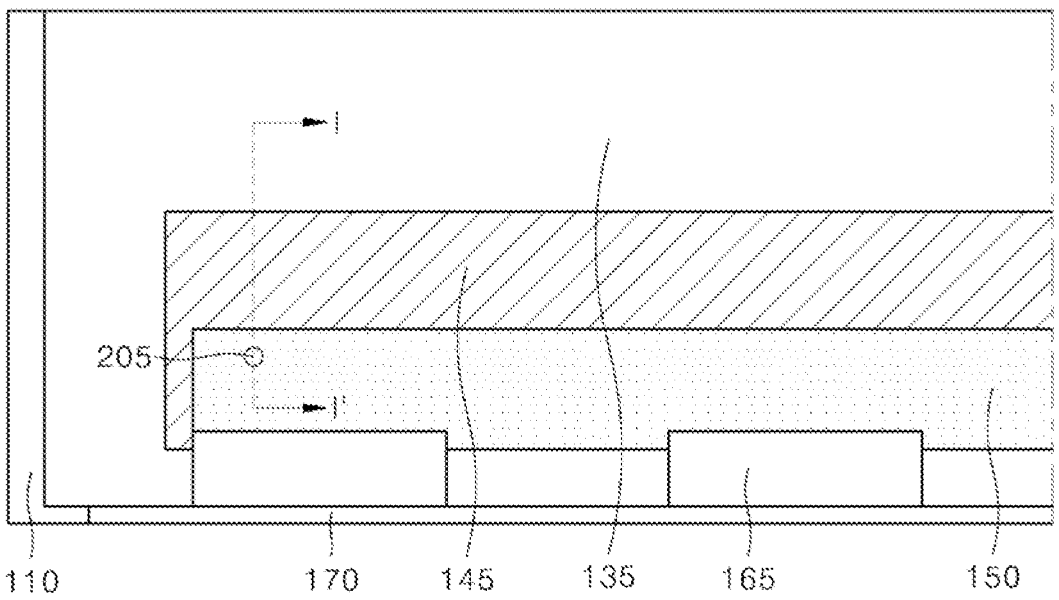
FIGS. 10 and 11 are diagrams showing a display device according to a fifth example of the present disclosure.
Figure 11:
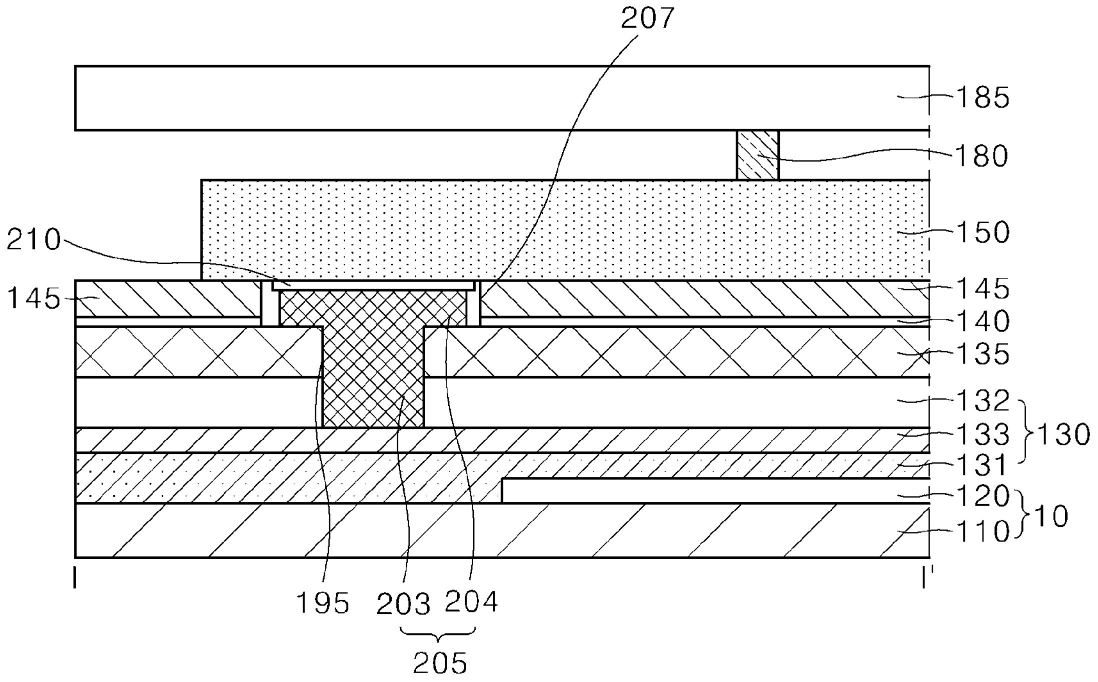

FIGS. 10 and 11 are diagrams showing a display device according to a fifth example of the present disclosure. In FIGS. 10 and 11, an arrangement position of the ground connection pattern is different from that in FIGS. 8 and 9, but the rest of the components are equally applied, so that descriptions of duplicated components are omitted or simplified.

Referring to FIGS. 10 and 11, the display device includes the sealing structure 130 for sealing the array substrate 10. The array substrate 10 can include the light-emitting array 120 and the transistor array 110. The sealing structure 130 can have the structure in which the first adhesive layer 131, the metal barrier layer 133, and the second adhesive layer 132 are stacked.

The metal barrier layer 133 can have the relatively smaller thickness than the first adhesive layer 131 and the second adhesive layer 132. Moreover, each of the first adhesive layer 131 and the second adhesive layer 132 can have the relatively greater thickness than the metal barrier layer 133. That is, the sealing structure 130 can include a component for separating the first adhesive layer 131 and the second adhesive layer 132 from each other, such as the metal barrier layer 133, and the metal barrier layer 133 can have a thin-film shape and can be disposed between the first adhesive layer 131 and the second adhesive layer 132, which are relatively thicker than the metal barrier layer 133.

The protective layer 135 can be disposed on the sealing structure 130. The protective layer 135 and the second adhesive layer 132 of the sealing structure 130 can include the trench grooves 195 extending therethrough. The trench groove 195 can expose a portion of the surface of the upper surface of the metal barrier layer 133.

When viewed from a plane, the trench groove 195 can have the island shape surrounded by the second adhesive layer 132, but the trench groove 195 can have any shape. For example, the trench groove 195 can have any shape such as a rectangle, a square, a circle, or an ellipse when viewed from the plane. The trench groove 195 can be provided in plurality, such that the display device cancan include two or more trench grooves.

A ground connection pattern 205 can fill the trench groove 195 (e.g., be disposed in the trench groove 195). The ground connection pattern 205 can include a body 203 whose bottom surface is in contact with the upper surface of the metal barrier layer 133 and a head 204 extending from the body 203 and extending to and covering a portion of the upper surface of the protective layer 135. That is, the head 204 can overlap the protective layer 135. Because the ground connection pattern 205 has the head 204 that is relatively wider than the body 203, the ground connection pattern 205 can have a 'T' shape when viewed in a cross-section.

The reinforcing substrate 145 can be disposed on the same plane as the head 204 of the ground connection pattern 205, as shown in FIG. 11. The reinforcing substrate 145 can be disposed on the protective layer 135 and can be attached to the protective layer via an adhesive layer 140. The reinforcing substrate 145 can include an opening area 207 for exposing a portion of the upper surface of the protective layer 135. The opening area 207 can expose the head 204 of the ground connection pattern 205. Accordingly, the opening area 207 can be defined to have a greater width than the head 204 of the ground connection pattern 205.

The printed circuit board 150 can be disposed on the reinforcing substrate 145. The printed circuit board 150 can be disposed to overlap the opening area 207 from which the head 204 of the ground connection pattern 205 is exposed. A grounding member 210 can be disposed on a rear surface of the printed circuit board 150 so as to be in contact with the head 204 of the ground connection pattern 205. Accordingly, the unnecessary electromagnetic signals can be emitted to the outside via the grounding member 210 and the ground connection pattern 205 for connecting the printed circuit board 150 and the metal barrier layer 133 to each other.

Moreover, as the grounding member 210 is disposed on the rear surface of the printed circuit board 150 and formed to be in contact with the ground connection pattern 205, the ground path that has been extended to the outermost portion of the display device can be reduced in the length. In other words, as the ground connection pattern 205 is disposed at the position overlapping the printed circuit board 150, there is the effect of shortening the ground path length.

Accordingly, any unnecessary electromagnetic signals can be emitted to the outside more quickly. An upper surface of the head of the ground connection pattern 205 can be positioned at a lower level than the upper surface of the reinforcing substrate 145 so as to be in contact with the grounding member 210 disposed on the rear surface of the printed circuit board 150. The grounding member 210 can be inserted into the opening area 207 of the reinforcing substrate 145. Accordingly, the display device can be maintained with a small thickness.

Moreover, as the grounding member 210 that is in contact with the metal barrier layer 133 by extending through the protective layer 135 and the second adhesive layer 132 of the sealing structure 130 is formed, the occurrence of the grounding defects that can occur because the outermost side surface of the metal barrier layer 133 is not exposed when the ground connection pattern is connected at the outermost portion of the sealing structure 130 can be prevented.

Moreover, as the metal barrier layer 133 disposed between the relatively thick first adhesive layer 131 and second adhesive layer 132 is stably grounded with the printed circuit board 150 via the ground connection pattern 205 and the grounding member 210, there is an effect of reducing susceptibility to electromagnetic interference (EMI).

Moreover, the cracks can be prevented from occurring due to the contraction and the expansion of the cured surface of the conductive paste disposed on the outermost portion of the display device.

The gasket member 180 can be disposed on the upper surface of the printed circuit board 150. The gasket member 180 can include the conductive material. The bottom cover 185 can be disposed on the gasket member 180. The bottom cover 185 can accommodate the array substrate 10, the sealing structure 130, and the reinforcing substrate 145, and can include the metal material.

FIGS. 12 to 15 are diagrams illustrating a method for manufacturing a display device according to an example of the present disclosure.

Figure 12:
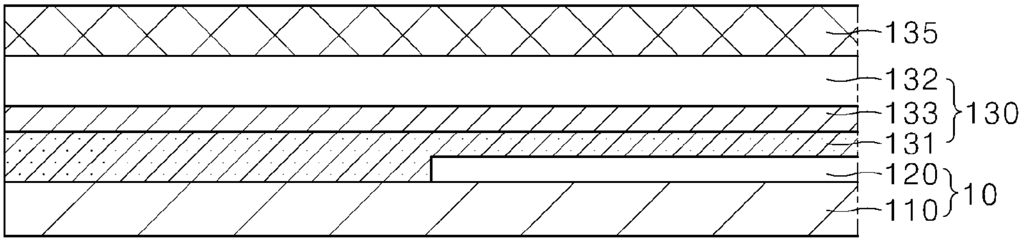
FIGS. 12 to 16 are diagrams illustrating a method for manufacturing a display device according to an example of the present disclosure.

Referring to FIG. 12, the sealing structure 130 for sealing the array substrate 10 is formed. In addition, the protective layer 135 is formed on the sealing structure 130. The array substrate 10 can include the light-emitting array 120 including the organic light-emitting element and the transistor array 110 including the pixel circuit that operates the organic light-emitting element.

The sealing structure 130 can seal the light-emitting array 120, and can include the first adhesive layer 131, the metal barrier layer 133, and the second adhesive layer 132. Each of the first adhesive layer 131 and the second adhesive layer 132 can include the polymer material having the adhesiveness (e.g., adhesive characteristics).

The metal barrier layer 133 can include a metal material. In one example, the metal barrier layer 133 can be in the form of a thin-film, including a metal material, such as aluminum (Al), copper (Cu), tin (Sn), silver (Ag), iron (Fe), and zinc (Zn).

The metal barrier layer 133 can have the relatively smaller thickness than the first adhesive layer 131 and the second adhesive layer 132. Moreover, each of the first adhesive layer 131 and the second adhesive layer 132 can have the relatively greater thickness than the metal barrier layer 133. That is, the sealing structure 130 can include the component for separating the first adhesive layer 131 and the second adhesive layer 132 from each other as the metal barrier layer 133 in the thin-film shape is disposed between the first adhesive layer 131 and the second adhesive layer 132, which are relatively thicker than the metal barrier layer 133.

The protective layer 135 can be disposed on (e.g., deposited on) the second adhesive layer 132 located at the uppermost portion of the sealing structure 130 and the protective layer 135 cancan be made of the insulating material including polyethylene terephthalate (PET). The protective layer 135 can be disposed on the second adhesive layer 132 to further secure the rigidity of the display device. As the protective layer 135 is disposed on the uppermost portion of the sealing structure 130, when the impact is applied to the display device from the outside, the array substrate 10 having the lower light-emitting array 120 can be prevented from being damaged.

Figure 13:
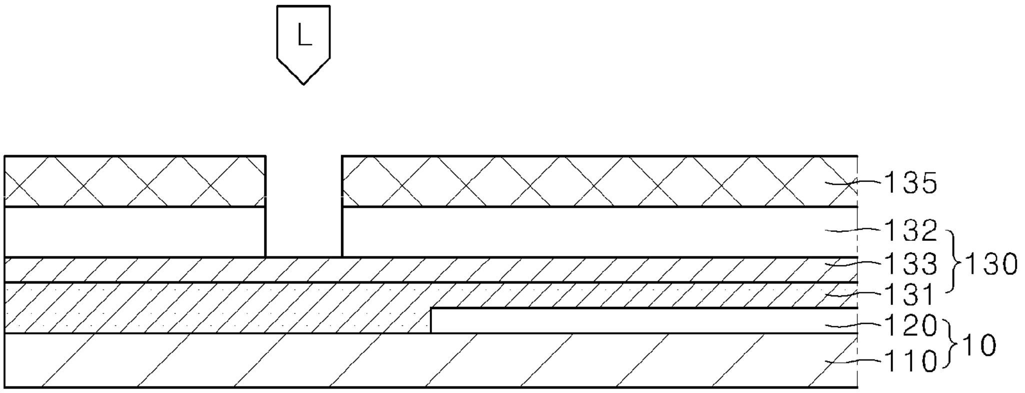

Referring to FIG. 13, a laser processing process is performed on the array substrate 10 on which the protective layer 135 is formed. In the processing process using the laser, a laser L can be irradiated onto the array substrate 10 to define the trench groove 195 in partial areas of the protective layer 135 and the second adhesive layer 132. That is, the trench groove 195 can be formed into the protective layer 135 and the second adhesive layer 132 by the laser irradiation from the laser L. The laser irradiation is as known in the art. The laser processing process can proceed to a point where the upper surface of the metal barrier layer 133 is exposed. In one example, the trench groove 195 can be defined on a bezel area located at an outermost portion of an outer side of the display area. The trench groove 195 can have the island shape when viewed from a plane (e.g., a stacking direction). For example, when viewed from the plane, the trench groove 195 can have any shape, such as a rectangle, a square, a circle, an ellipse, or the like.

Figure 14:
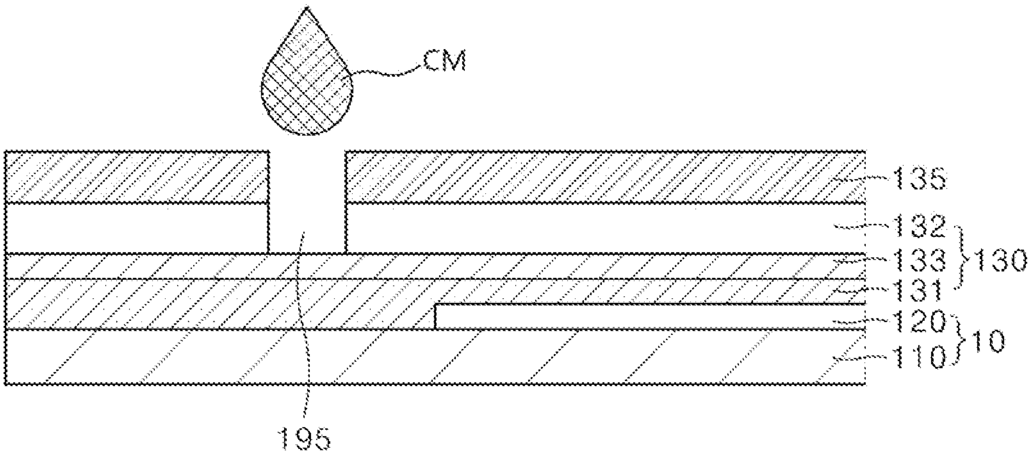

Referring to FIG. 14, a conductive material CM is applied to fill the inside of the trench groove 195. The conductive material CM can include the silver (Ag) paste, but may not be limited thereto. For example, the conductive material CM can be applied as long as it is a material that can be applied in a liquid form and have electrically conductive properties. The conductive material CM can be applied so as to extend to and cover the portion of the upper surface of the protective layer 135 while entirely filling the inside of the trench groove 195. The portion of the upper surface of the protective layer 135 can include any area of the upper surface of the protective layer 135 that is exposed due to the laser irradiation.

Figure 15:
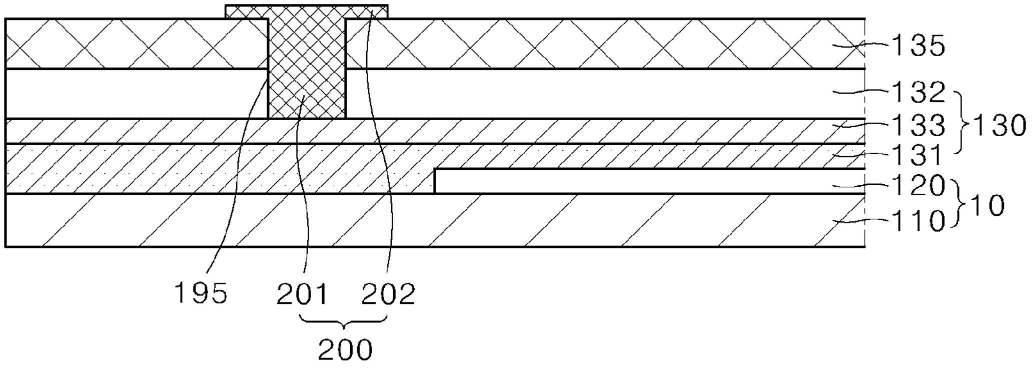

Next, as shown in FIG. 15, the ground connection pattern 200 is formed by curing the conductive material CM that has filled the trench groove 195. The ground connection pattern 200 can include the body 201 whose bottom surface is in contact with the upper surface of the metal barrier layer 133 and the head 202 extending from the body 201 and extending to and covering the portion (e.g., portion exposed by laser irradiation to form the trench 195) of the upper surface of the protective layer 135. Because the ground connection pattern 200 has the head 202 that is relatively wider than the body 201, the ground connection pattern 200 can have the 'T' shape when viewed from the cross-section. Accordingly, an area of contact with the grounding member to be formed later can be increased. The ground connection pattern 200 can be formed to have the width W in the range from 1 mm to 3 mm.

Figure 16:
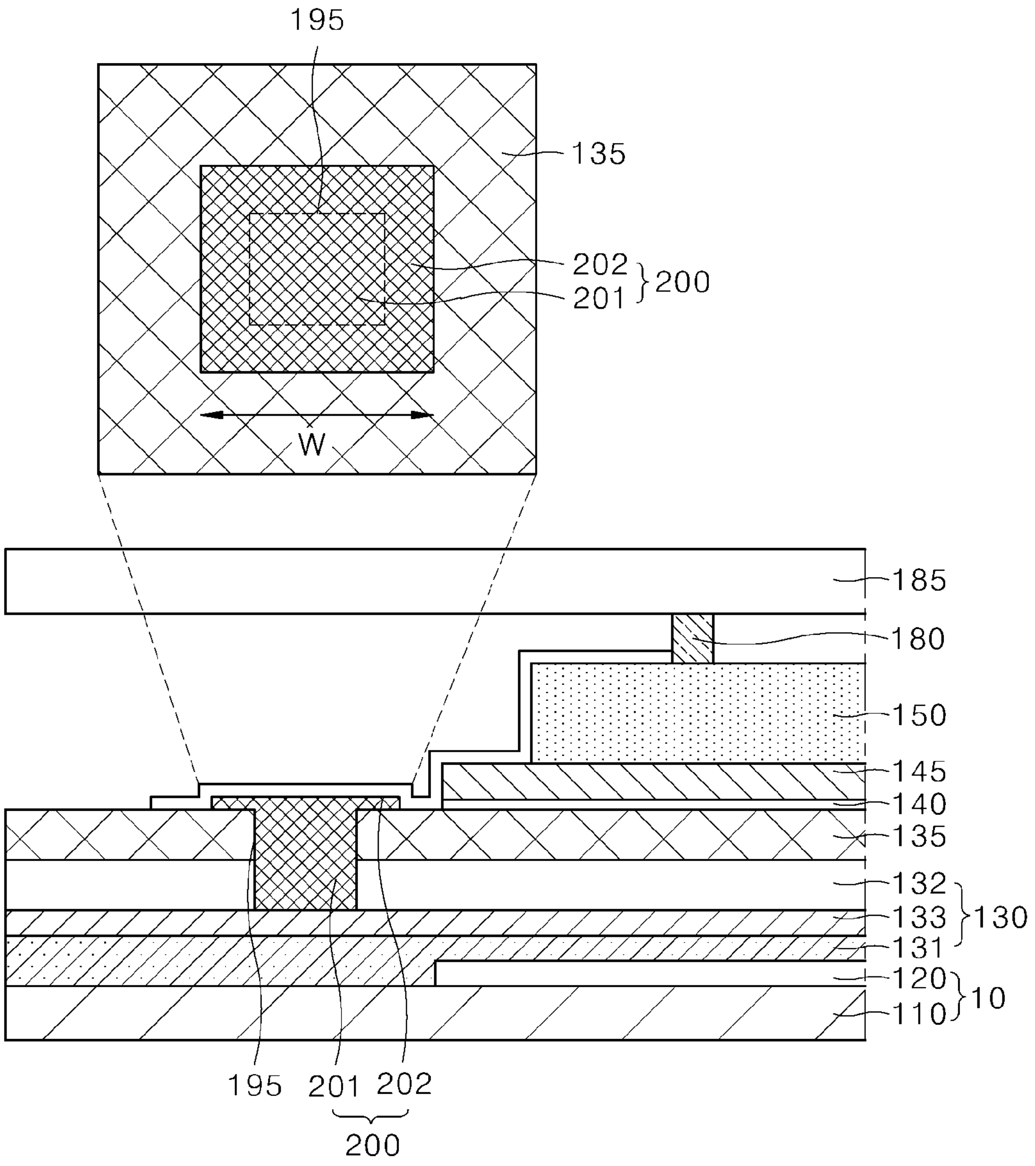

Referring to FIG. 16, the reinforcing substrate 145 and the printed circuit board 150 in the flat plate shape (e.g., planar shape) can be disposed on the protective layer 135. The reinforcing substrate 145 and the printed circuit board 150 can be disposed on a side opposite to the light emissive surface of the array substrate 10, that is, on a non-light emissive surface. The reinforcing substrate 145 can include the metal material to effectively disperse and dissipate the heat generated when the light-emitting array 120 emits the light. For example, the reinforcing substrate 145 can be made of the metal material, including a metal material, such as aluminum (Al), copper (Cu), tin (Sn), silver (Ag), iron (Fe), and/or zinc (Zn).

Thermal conductivity of Invar, which is made of an alloy of iron and nickel, which are materials having high thermal conductivity among the metal materials, is 16 W/K·m, and thermal conductivity of stainless steel (SUS) is 23.9 W/K·m. On the other hand, thermal conductivity of aluminum (Al) is 193 W/K·m, which is about 10 times higher than that of Invar and stainless steel (SUS), so that the heat can be more effectively dispersed. Accordingly, the heat dissipation effect can be more secured when aluminum (Al) is introduced into the reinforcing substrate 145 than when Invar or stainless steel (SUS) is introduced into the reinforcing substrate.

The printed circuit board 150 can be disposed on the reinforcing substrate 145. The printed circuit board 150 can be equipped with the components such as the integrated circuit chip that controls the driving timing of the array substrate 10.

The grounding member 155 is disposed between the printed circuit board 150 and the ground connection pattern 200. The grounding member 155 can extend from the upper surface of the printed circuit board 150 to the side edge of the printed circuit board 150, and can extend onto the upper surface of the reinforcing substrate 145 and the exposed surface of the protective layer 135. Moreover, the grounding member 155 can overlap the head 202 of the ground connection pattern 200 so as to be in contact therewith. The grounding member 155 can include the conductive tape including copper (Cu) as the conductive material.

The bottom cover 185 accommodating the array substrate 10, the sealing structure 130, and the reinforcing substrate 145 can be further included on the printed circuit board 150. The bottom cover 185 can be positioned to face the reinforcing substrate 145. The bottom cover 185 can be formed to include any metal material, but may not be limited thereto.

The gasket member 180 can be disposed between the printed circuit board 150 and the bottom cover 185. The gasket member 180 is for the grounding and shielding the electromagnetic waves, and is able to be connected to the grounding member 155.

In one example, as the grounding member 155 achieves the grounding by being connected from the gasket member 180 to the metal barrier layer 133 of the sealing structure 130 via the ground connection pattern 200, the unnecessary electromagnetic signals can be emitted to the outside. Accordingly, the occurrence of the noise due to the electromagnetic interference (EMI) can be prevented, thereby preventing deterioration of the image quality of the display device.

Moreover, as the ground connection pattern 200 that is in contact with the metal barrier layer 133 by extending through the protective layer 135 and the second adhesive layer 132 of the sealing structure 130, the ground path that has been extended to the outermost portion of the display device can be reduced in the length.

Accordingly, any unnecessary electromagnetic signals can be emitted to the outside more quickly. Moreover, the cracks can be prevented from occurring due to the contraction and the expansion of the cured surface of the conductive paste disposed on the outermost portion of the display device.

Moreover, as the ground connection pattern that is in contact with the metal barrier layer by extending through the protective layer and the second adhesive layer of the sealing structure is formed, the occurrence of the grounding defects that can occur because the outermost side surface of the metal barrier layer is not exposed when the ground connection pattern is connected at the outermost portion of the sealing structure can be prevented.

Moreover, as the metal barrier layer disposed between the relatively thick first adhesive layer and second adhesive layer is stably grounded with the printed circuit board via the ground connection pattern, there is the effect of reducing susceptibility to electromagnetic interference (EMI).

In one example of the method includes providing an array substrate, the array substrate including a display area having a plurality of pixel areas including a light-emitting array having a plurality of light-emitting elements corresponding to the plurality of pixel areas; forming a sealing structure on the array substrate to seal the light-emitting array, the sealing structure including a metal barrier layer; forming a protective layer on the sealing structure; forming a trench groove extending through the protective layer to expose a surface of the metal barrier layer; forming a ground connection pattern filling the trench groove; disposing a reinforcing substrate on the protective layer; disposing a printed circuit board on the reinforcing substrate; and disposing a grounding member connecting the printed circuit board and the array substrate to each other, the grounding member being in contact with the metal barrier layer via the ground connection pattern.

In one example of the method, the sealing structure further includes a first adhesive layer disposed on a first surface of the metal barrier layer facing the array substrate; and a second adhesive layer disposed on a second surface of the metal barrier layer opposite to the first surface of the metal barrier layer, and wherein the metal barrier layer is disposed between the first adhesive layer and the second adhesive layer.

In one example of the method, the ground connection pattern includes a body filling the trench groove; and a head extending from the body to an upper surface of the protective layer, and the head has a greater width than the body.

In one example of the method, the forming of the trench groove includes irradiating a laser onto the protective layer to a point where an upper surface of the metal barrier layer is exposed.

Although the embodiments of the present disclosure have been described in more detail with reference to the accompanying drawings, the present disclosure is not necessarily limited to these embodiments, and can be modified in a various manner within the scope of the present disclosure. Accordingly, the embodiments as disclosed in the present disclosure are intended to describe rather than limit the technical idea of the present disclosure.

What is claimed is:

1. A display device comprising:

an array substrate including:
- a display area having a plurality of pixel areas; and
- a light-emitting array including a plurality of light-emitting elements corresponding to the plurality of pixel areas;

a sealing structure positioned on the array substrate to seal the light-emitting array, and including a metal barrier layer;

a protective layer located on the sealing structure;

a reinforcing substrate positioned on the protective layer;

a printed circuit board positioned on the reinforcing substrate; and a grounding member connected to the printed circuit board, the array substrate and the metal barrier layer, wherein the sealing structure includes a first adhesive layer and a second adhesive layer, wherein the first adhesive layer is disposed on a first surface of the metal barrier layer facing the array substrate, wherein the second adhesive layer is disposed on a second surface opposite to the first surface of the metal barrier layer, and wherein the metal barrier layer is disposed between the first adhesive layer and the second adhesive layer.

2. The display device of claim 1, wherein the metal barrier layer has a smaller thickness than at least one of the first adhesive layer and the second adhesive layer.

3. The display device of claim 1, wherein the metal barrier layer is a thin-film including one of the following: aluminum (Al), copper (Cu), tin (Sn), silver (Ag), iron (Fe), and zinc (Zn).

4. The display device of claim 1, wherein the grounding member further provides an electrical path to an outer edge of the display device.

5. The display device of claim 1, further comprising:

a trench groove extending through the second adhesive layer and the protective layer and exposing a surface of the metal barrier layer; and a ground connection pattern including a body and a head.

6. The display device of claim 5, wherein the body of the ground connection pattern is disposed within the trench groove, and wherein the head of the ground connection pattern extends from the body and overlaps a portion of an upper surface of the protective layer.

7. The display device of claim 5, wherein the trench groove is surrounded by the second adhesive layer, and wherein the ground connection pattern has a 'T' shape in a cross-sectional view.

8. The display device of claim 5, further comprising:

a ground pad disposed on a rear surface of the printed circuit board, wherein the head of the ground connection pattern is connected to the ground pad.

9. The display device of claim 1, wherein the grounding member comprises a first grounding member and a second grounding member, and wherein the second grounding member is electrically connected to the first grounding member.

10. The display device of claim 9, wherein the first grounding member extends from an upper surface of the printed circuit board onto an exposed surface of the protective layer, and wherein the second grounding member overlaps the first grounding member, connected to an end of the first grounding member, and being in contact with an exposed surface of the metal barrier layer.

11. The display device of claim 9, wherein the first grounding member is a conductive tape, and the second grounding member is a line pattern.

12. The display device of claim 9, wherein the first grounding member comprises:

a first portion electrically connected to the printed circuit board; and a second portion electrically connected to the second grounding member.

13. The display device of claim 12, wherein the first portion extends from an upper surface of the printed circuit board onto an exposed surface of the protective layer, wherein the second portion is located on an upper surface of the reinforcing substrate, spaced apart from the first portion, and extending to an upper surface of the protective layer, and wherein the display device further includes a grounding extension pattern overlapping an end of the second portion of the grounding member and in contact with an exposed surface of the metal barrier layer.

14. The display device of claim 1, wherein the grounding member includes:

a grounding member pattern in the form of a line pattern extending from an upper surface of the printed circuit board to an exposed surface of the protective layer; and a grounding extension pattern overlapping an end of the grounding member pattern and in contact with an exposed surface of the metal barrier layer.

15. The display device of claim 1, wherein the array substrate further includes a base substrate having a first surface with the light-emitting array disposed thereon and a second surface opposite to the first surface, and wherein the light-emitting array emits light in a direction of the second surface of the base substrate.

16. A display device comprising:

an array substrate including:

a display area having a plurality of pixel areas; and a light-emitting array including a plurality of light-emitting elements corresponding to the plurality of pixel areas;

a sealing structure including:

a first adhesive layer positioned on the array substrate and sealing the light-emitting array;

a metal barrier layer disposed on the first adhesive layer; and a second adhesive layer disposed on the metal barrier layer, the first adhesive layer, the metal barrier layer and the second adhesive layer being stacked;

a protective layer positioned on the second adhesive layer;

a reinforcing substrate positioned on the protective layer;

a printed circuit board positioned on the reinforcing substrate; and a grounding member connecting the printed circuit board to the array substrate, wherein the grounding member is in contact with a surface of the metal barrier layer exposed in a trench groove, the trench groove extending through the protective layer and the second adhesive layer.

17. The display device of claim 16, further comprising a ground connection pattern including:

a body filling the trench groove; and a head extending from the body to an upper surface of the protective layer, wherein the grounding member is in contact with the head of the ground connection pattern.

18. The display device of claim 17, further including an opening area exposing the upper surface of the protective layer, wherein the grounding member is located on the printed circuit board, and is in contact with the head of the ground connection pattern.

19. The display device of claim 17, wherein the head extends from the body and overlaps a portion of the upper surface of the protective layer, and wherein the ground connection pattern has a 'T' shape in a cross-sectional view.

20. The display device of claim 18, wherein the opening area is disposed between the trench groove and the printed circuit board, and wherein the opening area overlaps with the trench groove.

21. The display device of claim 17, wherein the array substrate further includes a base substrate having a first surface with the light-emitting array disposed thereon and a second surface opposite to the first surface, and wherein the light-emitting array emits light in a direction of the second surface of the base substrate.

22. A display device comprising:

an array substrate including:

a transistor array; and a light-emitting array;

a sealing structure positioned on the array substrate to seal the light-emitting array, and including a metal barrier layer;

a protective layer positioned on the sealing structure;

a printed circuit board overlapping the protective layer; and a grounding member connected to the printed circuit board, the array substrate and the sealing structure, the grounding member being configured to emit electromagnetic signals to the outside, wherein the sealing structure includes a first adhesive layer and a second adhesive layer, wherein the first adhesive layer is disposed on a first surface of the metal barrier layer facing the array substrate, wherein the second adhesive layer is disposed on a second surface opposite to the first surface of the metal barrier layer, and wherein the metal barrier layer is disposed between the first adhesive layer and the second adhesive layer.

* * * * *